United States Patent
Matano

(10) Patent No.: US 8,351,292 B2
(45) Date of Patent: Jan. 8, 2013

(54) SEMICONDUCTOR DEVICE AND DATA PROCESSING SYSTEM

(75) Inventor: Tatsuya Matano, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 133 days.

(21) Appl. No.: 12/929,327

(22) Filed: Jan. 14, 2011

(65) Prior Publication Data

US 2011/0179210 A1 Jul. 21, 2011

(30) Foreign Application Priority Data

Jan. 15, 2010 (JP) .................................. 2010-007239

(51) Int. Cl.
*G11C 7/00* (2006.01)
(52) U.S. Cl. ....................................... 365/226; 365/214
(58) Field of Classification Search .................. 365/214, 365/226, 230.03
See application file for complete search history.

(56) References Cited

U.S. PATENT DOCUMENTS

| | | | | |
|---|---|---|---|---|
| 6,377,502 B1 * | 4/2002 | Honda et al. | ............. | 365/230.03 |
| 6,483,165 B2 * | 11/2002 | Ooishi et al. | .................. | 257/499 |
| 6,791,354 B2 * | 9/2004 | Mori et al. | ....................... | 326/40 |
| 7,139,183 B2 * | 11/2006 | Taussig et al. | .................. | 365/51 |
| 7,667,485 B2 * | 2/2010 | Sakata et al. | ..................... | 326/34 |
| 2009/0034353 A1 * | 2/2009 | Narui et al. | ..................... | 365/226 |

FOREIGN PATENT DOCUMENTS

JP 2002-74663 A 3/2002

* cited by examiner

*Primary Examiner* — VanThu Nguyen
(74) *Attorney, Agent, or Firm* — McGinn IP Law Group, PLLC

(57) ABSTRACT

A semiconductor device includes: first transmission wirings each transmitting a small-amplitude signal between one of a plurality of first drivers and one of a plurality of receivers; a second transmission wiring transmitting a reference signal connected to each of the plurality of receivers; and a second driver outputting the reference signal with an impedance higher than an impedance with which each of the first drivers outputs the small-amplitude signal. The second transmission wiring is arranged between first and second power supply wirings corresponding to first and second potentials of the small-amplitude signal. The first and second potentials are supplied to each of the first drivers. The plurality of first transmission wirings are arranged close to each other, without being sandwiched between the first and second power supply wirings.

5 Claims, 20 Drawing Sheets

RAMP(WAMP)

DURING READ OPERATION

DURING WRITE OPERATION

SEMICONDUCTOR DEVICE AND DATA PROCESSING SYSTEM

TECHNICAL FIELD

Reference to Related Application

This application is based upon and claims the benefit of the priority of Japanese patent application No. 2010-007239, filed on Jan. 15, 2010, the disclosure of which is incorporated herein in its entirety by reference thereto. The present invention relates to a semiconductor device and a data processing system. In particular, it relates to a semiconductor device including a plurality of transmission wirings for transmitting multiple-bit data in parallel and a data processing system using the semiconductor device.

In a semiconductor device such as a semiconductor memory device, multiple-bit data is transmitted in parallel between an internal circuit and an external connection terminal of the semiconductor device. In addition to high-speed operation and low power consumption, in this data transmission, data is required to be transmitted without noise-related malfunctions and with the smallest possible number of wirings or the like. Examples of the method for this data transmission include a method using a single-ended signal and a method using a differential signal. If a single-ended signal is used, to prevent noise-related malfunctions, the amplitude of the signal needs to be increased. However, if the amplitude is increased, the power consumption is increased by charging/discharging, and the data transmission speed is decreased. In contrast, if a differential signal is used for data transmission, since the impact of noises is reduced, the amplitude of the transmission signal can be decreased, and data can be transmitted at higher speed. However, if a differential signal is used for data transmission, two wirings are needed to transmit 1-bit data. Thus, if a larger number of bits are used to transmit data in parallel, the wiring area is increased.

Patent Document 1 discloses a technique to eliminate noises mixed into an RF signal supplied from a pickup of an optical disc device. Based on this technique, a signal line transmitting the RF signal and a signal line transmitting a reference voltage are arranged close to each other, and these signal lines are inputted to a differential amplifier to generate a differential signal. Patent Document 1 discloses that, since the signal line and the reference voltage signal line are arranged close to each other, even if noises are mixed, the noises are inputted to the differential amplifier with the same phase, and as a result, the noises negate each other.

Patent Document 1:
Japanese Patent Kokai Publication No. JP2002-074663A

SUMMARY

The following analyses are given by the present invention. If a reference potential inputted to the differential amplifier is generated at a location far from a signal line driver with respect to the signal line, unlike the signal line, the reference potential is not affected by common noises generated from a substrate or the like or by power-supply noises generated when the signal line is driven. Thus, fluctuations of the signal line directly result in signal loss of the differential amplifier.

Further, if the signal line and the reference signal are arranged in parallel to each other so that the same-phase common noises are mixed, in order to generate the power supply noises with the same phase, it is necessary to drive the signal line driver and the reference signal driver by an identical power supply at an identical location and to equalize the output impedance of the signal line driver and the reference signal driver. If the signal line driver and the reference signal driver have different output impedances, even if the signal line and the reference line are arranged close to each other, the lines are affected by the same-phase noise differently. Therefore, the same-phase noise cannot be eliminated sufficiently. Thus, for high-speed signal transmission, not only the output impedance of the signal line driver but also the output impedance of the reference signal driver needs to be decreased. However, if the output impedance of the reference signal driver is decreased, the power consumption is increased. For example, if a complementary metal-oxide semiconductor (CMOS) is used to configure the signal line driver, current flow can be prevented as long as the signal does not change. However, in order to constantly output the reference signal at a midpoint potential with a low impedance, a current needs to be caused to flow constantly through the reference signal driver.

According to a first aspect of the present invention, there is provided a semiconductor device that includes: a plurality of first receivers, each operating at a first operation voltage, receiving a single-ended input signal having a small amplitude, and having a function of sensing the input signal; a plurality of first drivers, each operating at a second operation voltage lower than the first operation voltage and outputting the small-amplitude input signal having a first voltage difference with a first impedance value; and a plurality of first transmission wirings, each having a first length corresponding to a distance between one of the first drivers and one of the first receivers and transmitting the input signal. The semiconductor device further includes: a common reference signal inputted to each of the plurality of first receivers; a second driver operating at the second operation voltage and outputting the reference signal with a second impedance value higher than the first impedance value; a second transmission wiring having at least the first length and transmitting the reference signal; and first and second internal power supply generation circuits, relating to the second operation voltage, generating high- and low-side potentials of the input signal, respectively, supplying the potentials to each of the plurality of first drivers, and outputting the potentials to first and second power supply wirings having at least the first length, respectively. The second transmission wiring is arranged between the first and second power supply wirings, without the plurality of first transmission wirings being arranged between the first and second power supply wirings. The plurality of first transmission wirings are arranged close to each other, without being sandwiched between the first and second power supply wirings.

According to a second aspect of the present invention, there is provided a semiconductor device that includes: a plurality of first transmission wirings, each having a first node included in a first region and a second node included in a second region; a second transmission wiring having a third node included in the first region and a fourth node included in the second region; a plurality of first drivers, each generating a small-amplitude signal that transitions (changes) between first and second potentials with a first impedance and outputting the small-amplitude signal to one of the first and second nodes of one of the plurality of first transmission wirings that is connected to the corresponding first driver, the plurality of first drivers being arranged in one of the first and second regions; a second driver generating a reference voltage signal having a midpoint potential between the first and second potentials with a second impedance higher than the first impedance, outputting the reference voltage signal to one of the third and fourth nodes that is included in the second transmission wiring and that is arranged in the same region to which each of the plurality of first drivers outputs the small-amplitude signal, and being arranged in the same region where the plurality of first drivers are arranged; a plurality of first receivers, each connected to the other node of the third and fourth nodes of the second transmission wiring in a region opposite to the region to which each of the plurality of first drivers outputs the small-amplitude signal, connected to the other node of the first and second nodes of each of the plurality of first transmission wirings in a region opposite to the region where the plurality of first drivers are arranged, and receiving the reference voltage signal and the small-amplitude signal; a first power supply wiring having the first potential and having a fifth node in the first region and a sixth node in the second region; and a second power supply wiring having the second potential and having a seventh node in the first region and an eighth node in the second region. The second transmission wiring is arranged to extend in a first direction between the first and second power supply wirings that are arranged to extend in the first direction, without the plurality of first transmission wirings being arranged between the first and second power supply wirings. The plurality of first transmission wirings are arranged close to each other to extend in the first direction, without being sandwiched between the first and second power supply wirings.

According to a third aspect of the present invention, there is provided a data processing system that includes: a first semiconductor device; a second semiconductor device; and a system bus connecting the first and second semiconductor devices. The first semiconductor device includes: a data storage unit; a plurality of first transmission wirings; a second transmission wiring; a plurality of first drivers, each generating a small-amplitude signal that transitions (changes) between first and second potentials with a first impedance, outputting the small-amplitude signal to one end of a corresponding one of the plurality of first transmission wirings connected to the plurality of first drivers, and arranged in a first region; a second driver generating a reference voltage signal having a midpoint potential between the first and second potentials with a second impedance higher than the first impedance, outputting the reference voltage signal to one end of the second transmission wiring connected to the second driver, and arranged in the first region; a plurality of first receivers, each connected to the other end of the second transmission wiring and to the other end of the corresponding one of the plurality of first transmission wirings, receiving the reference voltage signal and the small-amplitude signal, and arranged in a second region; a first power supply wiring having the first potential and having one end in the first region and the other end in the second region; and a second power supply wiring having the second potential and having one end in the first region and the other end in the second region. The second transmission wiring is arranged between the first and second power supply wirings, without the plurality of first transmission wirings being arranged between the first and second power supply wirings. The plurality of first transmission wirings are arranged close to each other, without being sandwiched by the first and second power supply wirings. In response to a request from the second semiconductor device, the first semiconductor device outputs data stored in the data storage unit to the system bus via the plurality of first drivers, the plurality of first transmission wirings, and the plurality of first receivers.

The meritorious effects of the present invention are summarized as follows. According to the present invention, if a potential of the first and/or second power supply wiring fluctuates, the potential of the second transmission wiring fluctuates along with the potential of the first and/or second power supply wiring. Thus, even if the second driver has a high impedance, there is less impact of power-supply noises.

Therefore, the amplitude of the transmission signal can be reduced, and an increase in the number of wirings that increases with an increase in the bit number of data transmitted in parallel can be suppressed. In addition, faster signal transmission and lower power consumption can be realized.

PREFERRED MODES

Figure 1:
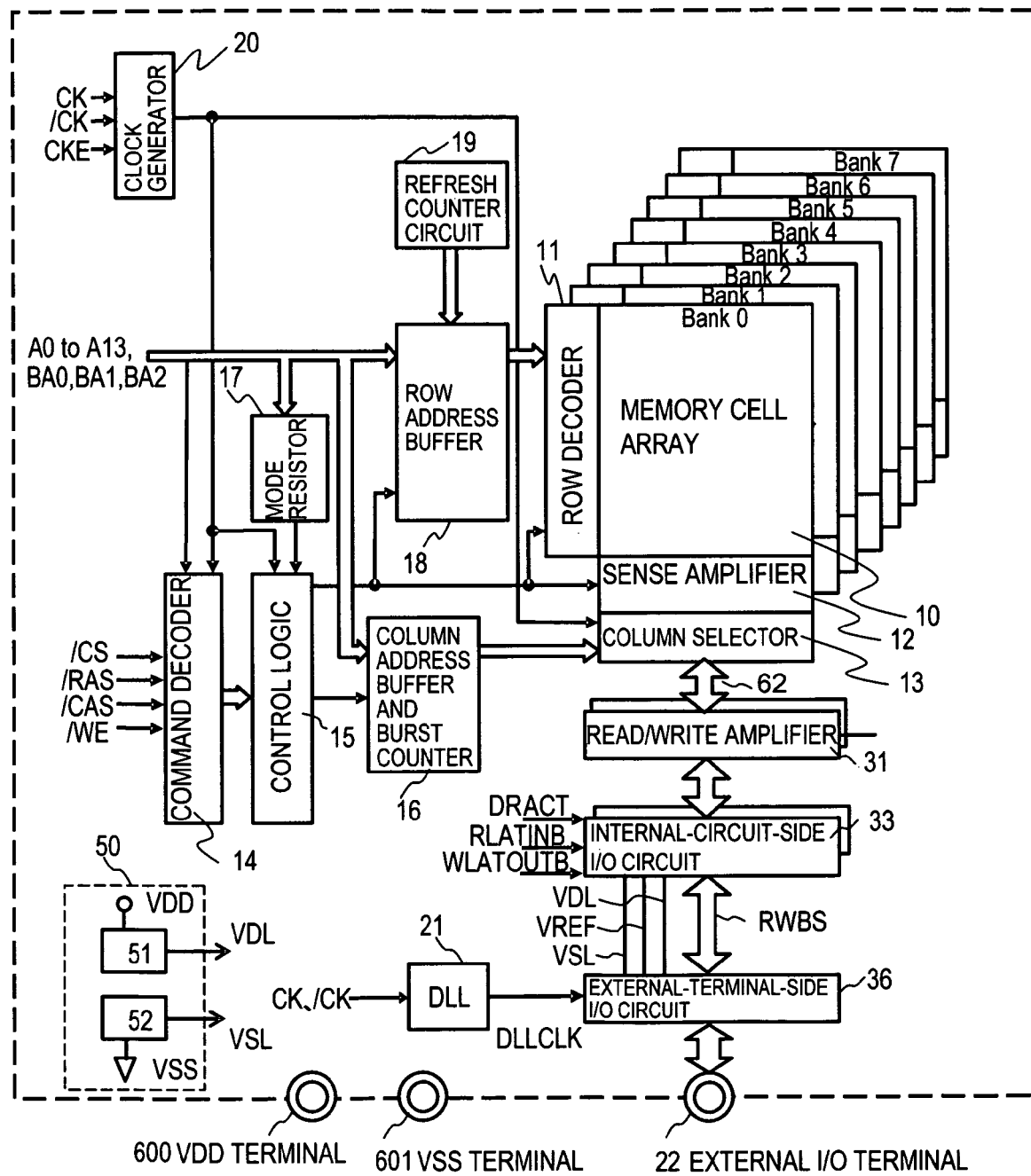
FIG. 1 is a block diagram of an overall configuration of a semiconductor device according to example 1 of the present invention.

According to a representative exemplary embodiment of the present invention, since a plurality of first transmission wirings transmit small-amplitude signals in parallel and a second transmission wiring transmit a common reference signal, a smaller number of transmission wirings can be used, compared with the number of transmission wirings used to transmit differential signals. Further, since first receivers can determine the level of each of the small-amplitude signals based on the reference signal, the amplitude of each small-amplitude signal can be reduced, and the small-amplitude signal can be transmitted at high speed with low power consumption.

In addition, since a second driver outputting the reference signal has a second impedance value higher than a first impedance value of each of first drivers outputting the small-amplitude signals, each small-amplitude signal can be transmitted at high speed, and even when the second driver is in a stand-by state while maintaining the reference signal at a midpoint voltage, the power consumption of the second driver can be reduced.

In addition, the second transmission wiring transmitting the reference signal is arranged between a first and a second power supply wirings connected to a first and a second potentials, which correspond to potentials of each of the small-amplitude signals. The first transmission wirings are arranged far from the first and second power supply wirings. Since the first drivers have a relatively low impedance, the small-amplitude signals transmitted through the first transmission wirings quickly follow potential fluctuations of the first and/or second power supply wiring. In contrast, since the second driver has a relatively high impedance, even if a potential of the first and/or second power supply wiring fluctuates, the reference signal transmitted through the second transmission wiring does not quickly follow the fluctuation. However, since the second transmission wiring is arranged between the first and second power supply wirings and interwiring capacitance is given, the reference signal transmitted through the second transmission wiring can also follow potential fluctuations of the first and second power supply wirings, in the same way as the small-amplitude signals transmitted through the first transmission wirings. Thus, even if the first potential of the first power supply wiring and/or the second potential of the second power supply wiring is affected by power-supply noises or the like, the impact can be reduced.

The above meritorious effects can be achieved by increasing the interwiring capacitance between the second transmission wiring and the first power supply wiring and the interwiring capacitance between the second transmission wiring and the second power supply wiring and by decreasing, relative to these interwiring capacitances, the interwiring capacitance between each of the first transmission wirings and the first power supply wiring and the interwiring capacitance between each of the first transmission wirings and the second power supply wiring. More preferably, it is desirable that the interwiring capacitance between the second transmission wiring and the first power supply wiring and the interwiring capacitance between the second transmission wiring and the second power supply wiring be equal to each other.

Examples of the present invention will be hereinafter described in detail with reference to the drawings.

Example 1

FIG. 1 is a block diagram of an overall configuration of a semiconductor device 1 according to example 1. The semiconductor device 1 of FIG. 1 is a synchronous dynamic random access memory (SDRAM), such as a double data rate (DDR) SDRAM. In FIG. 1, the semiconductor device 1 includes: memory cell arrays 10; row decoders 11 decoding row addresses and driving selected word lines (not illustrated); sense amplifiers 12 sensing data from memory cells (not illustrated) selected from the memory cell arrays; and column selectors 13 selecting data from a plurality of data sensed by the sense amplifiers 12 based on column addresses and outputting the data to the outside of the memory cell arrays 10. The semiconductor memory device 1 includes eight memory cell arrays 10 (Bank 0 to Bank 7), each of which is provided with one of the row decoders 11, one of the sense amplifiers 12, and one of the column selectors 13.

A clock generator 20 generates an internal operation clock from a non-inverted clock signal CK, an inverted clock signal /CK, and a clock enable signal CKE supplied from the outside. A command decoder 14 decodes a chip select signal /CS, a row address strobe signal /RAS, a column address strobe signal /CAS, and a write enable signal /WE supplied from the outside. The command decoder 14 decodes, for example, read and write commands supplied to the semiconductor device 1 from an external memory controller or the like. Based on a command decoded by the command decoder 14 and the state of a mode resistor 17, a control logic 15 outputs a signal necessary to execute the command to each unit of the semiconductor device 1 in synchronization with a clock supplied by the clock generator 20. Each of the mode resistor 17, a column address buffer and burst counter 16, and a row address buffer 18 is connected to external address input terminals A0 to A13 and bank address input terminals BA0, BA1, and BA2 via an internal address bus. Upon receiving a mode register set command, the mode register 17 sets data supplied via the internal address bus in a register. Upon receiving a bank active ACT command, the row address buffer 18 latches a row address and outputs the row address to the row decoder 11. Upon receiving a read or write command, the column address buffer and burst counter 16 latches and decodes a column address to select the column selector 13. Further, upon receiving a burst read or write command, the column address buffer and burst counter 16 counts column addresses based on a specified burst length. A refresh counter circuit 19 counts up refresh addresses. Further, based on the external clock signals supplied via external clock terminals CK and /CK, a delay-locked loop (DLL) 21 generates a clock signal having a phase aligned with that of the external clock signals, so as to control timings at which data is inputted/outputted via external input/output (I/O) terminals 22.

Each of the eight memory cell arrays 10 (Bank 0 to Bank 7) is provided with a read/write amplifier 31 and an internal-circuit-side I/O circuit 33 outside the memory cell arrays 10. When a read command is executed, for example, one of the read/write amplifiers 31 senses memory cell data read to the outside of the memory cell arrays 10 via a corresponding sense amplifier 12, column selector 13, and I/O line 62. When a write command is executed, for example, one of the read/write amplifiers 31 receives write data from a corresponding external I/O terminal 22 via a corresponding external-terminal-side I/O circuit 36, read/write data bus RWBS, and internal-circuit-side I/O circuit 33 and writes the data in a corresponding memory cell array 10.

The internal-circuit-side I/O circuits 33 output data sensed by the read/write amplifiers 31 to the read/write data buses RWBS during a read operation. The internal-circuit-side I/O circuits 33 acquire write data from the read/write data buses RWBS and transmit the write data to the read/write amplifiers 31 during a write operation.

The read/write data buses (first transmission wirings) RWBS are parallel data buses connecting the memory cell arrays 10 and the external I/O terminals 22. As will be described in detail later, each of the read/write data buses RWBS transmits a signal having a small amplitude. A reference voltage signal wiring (second transmission wiring) VREF, transmitting a reference voltage to determine the high and low levels of the small-amplitude signal, is sandwiched between internal power supply wirings VDL and VSL, which are used for a power supply of the small-amplitude signal. The reference voltage signal wiring VREF extends between the internal-circuit-side I/O circuits 33 and the external-terminal-side I/O circuits 36. While the read/write data buses RWBS are multiple-bit buses, the reference voltage signal VREF is a single signal wiring (second transmission wiring). An internal power supply generation circuit 50 generates internal power supplies VDL and VSL. For example, the internal power supply wirings VDL and VSL are supplied from a high-side VDD terminal 600 and a low-side VSS terminal 601, which are external terminals of the semiconductor device 1.

The external-terminal-side I/O circuits 36 are arranged to correspond to the external I/O terminals 22 (only one terminal is illustrated in FIG. 1), which are external terminals of the semiconductor device 1. During a read operation, the external-terminal-side I/O circuits 36 convert read data inputted in parallel via the read/write data buses RWBS into serial data and output the serial data via the external I/O terminals 22 in synchronization with the signal DLLCLK outputted by the DLL 21. During a write operation, the external-terminal-side I/O circuits 36 convert write data captured from the external I/O terminals 22 into parallel data and output the parallel data to the read/write data buses RWBS in synchronization with the signal DLLCLK outputted by the DLL 21.

Write data and read data is inputted to and outputted from the external I/O terminals 22, respectively. While FIG. 1 illustrates only one external I/O terminal 22, synchronous DRAMs such as those of a DDR type generally have 4 to 16 terminals. During a write operation, data inputted in serial from 4 to 16 external I/O terminals 22 is converted into parallel data of 8 to 128 bits by the external-terminal-side I/O circuits 36. Next, the parallel data is transmitted to the internal-circuit-side I/O circuits 33 of the corresponding banks via the read/write data buses RWBS. Next, the parallel data is written in an applicable memory cell array 10. During a read operation, read data read out to the external-terminal-side I/O circuits 36 via the read/write data buses RWBS as parallel data of 8 to 128 bits is converted into serial data by the external-terminal-side I/O circuits 36. The serial data is next outputted from the 4 to 16 external I/O terminals 22. The bit number of the read/write data buses RWBS is 8, when 2-bit data inputted/outputted via four external I/O terminals 22 is transmitted in parallel. The bit number of the read/write data buses RWBS is 128, when 8-bit data inputted/outputted by burst transmission via each of the 16 external I/O terminals 22 is transmitted in parallel.

Figure 2:
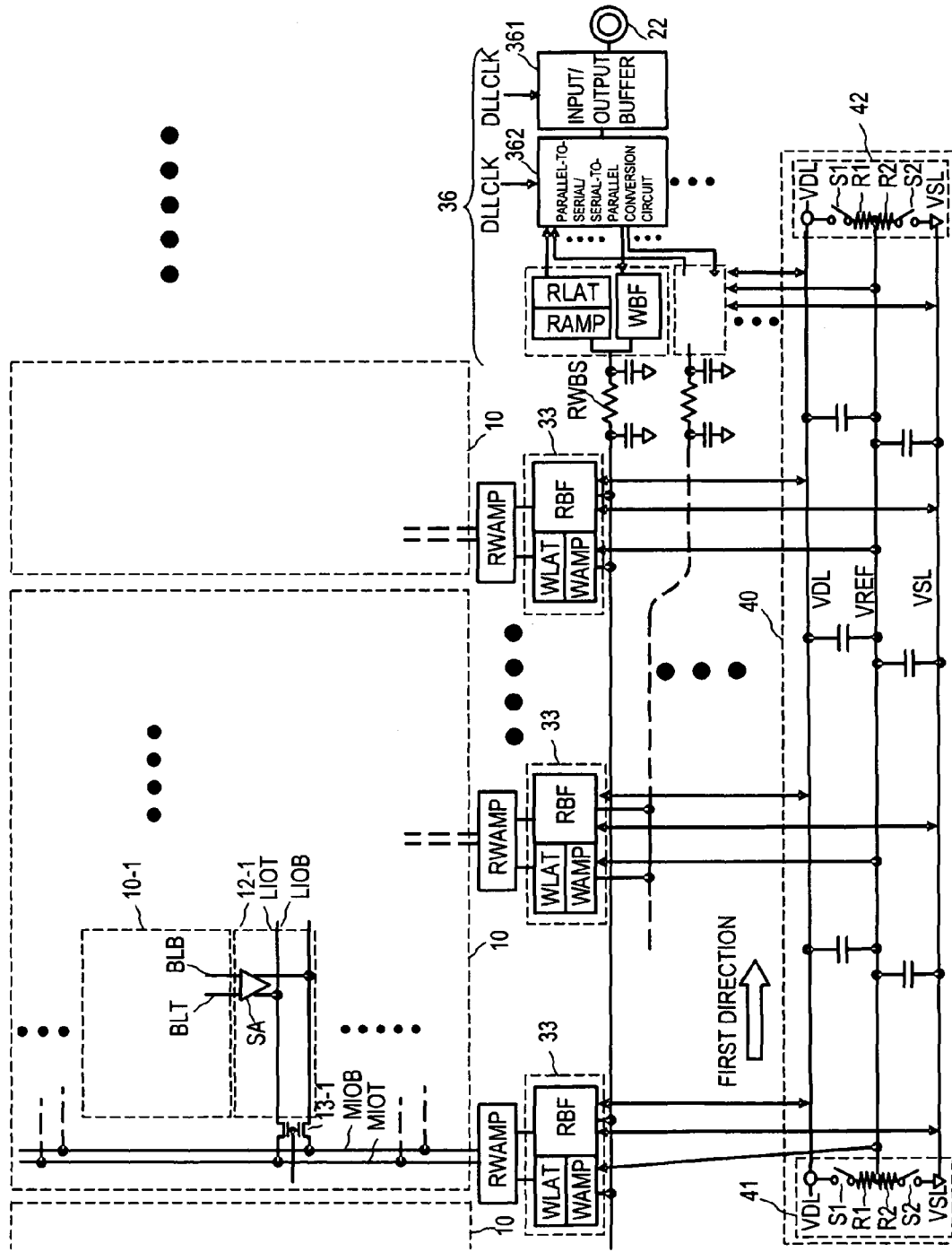
FIG. 2 is a block diagram of an overall configuration of an interface section between a memory cell array and a data input/output terminal of the semiconductor device according to example 1.

FIG. 2 is a block diagram of an overall configuration of an interface section between a group of the memory cell arrays 10 and an external I/O terminal 22 of the semiconductor device 1 according to example 1. FIG. 2 illustrates only three of the eight memory cell arrays 10. Namely, illustration of the other memory cell arrays 10 is omitted. Further, FIG. 2 illustrates only one of the 4 to 16 external I/O terminals 22. Namely, illustration of the other external I/O terminals 22 is omitted.

In FIG. 2, each of the memory cell arrays 10 is a memory cell array of one bank. The banks of the memory cell arrays 10 are separated from each other, and each bank includes a plurality of partial areas 10-1. Each of the partial areas 10-1 includes a plurality of sense amplifiers SA, and a group of the sense amplifiers SA is arranged as a sense amplifier column 12-1. Bit lines BLT and BLB are connected to local IO lines LIOT and LIOB via a sense amplifier SA. Further, a pair of local IO lines LIOT and LIOB is connected to a pair of main IO lines MIOT and MIOB via a read/write gate 13-1, and the pair of the main IO lines MIOT and MIOB is connected to a read/write amplifier RWAMP (31 in FIG. 1). Each of the banks of the memory cell arrays 10 includes a plurality of partial areas 10-1 in matrix, and each partial area 10-1 is provided with a sense amplifier column 12-1 and a pair of local IO lines LIOT and LIOB. Further, while FIG. 2 illustrates only one pair of the main IO lines MIOT and MIOB, each of the memory cell arrays 10 includes a plurality of pairs of memory IO lines MIOT and MIOB, and a plurality of read/write amplifiers RWAMPs corresponding to the pairs of the memory IO lines MIOT and MIOB are arranged.

Each of the internal-circuit-side I/O circuits 33 includes a read data buffer RBF, a write data latch WLAT, and a write data receiver WAMP. The read data buffer RBF includes: a latch circuit temporarily storing read data read from a corresponding read/write amplifier RWAMP; and a drive circuit outputting data held by the latch circuit to a corresponding read/write data bus RWBS as a small-amplitude signal. When a write command is executed, the write-data amplifier (second receiver) WAMP senses the small-amplitude signal transmitted through the read/write data bus RWBS. While the write-data amplifier WAMP is also connected to the reference voltage signal VREF. The write data latch WLAT is a latch circuit temporarily holding data sensed by the write-data amplifier WAMP when a write command is executed until the data is written in a corresponding memory cell array 10. The internal-circuit-side I/O circuits 33 correspond to the read/write amplifiers RWAMPs, and thus, each of a plurality of internal-circuit-side I/O circuits 33 is arranged per bank.

The read/write data buses RWBS are bidirectional buses formed by 8 to 128 transmission wirings. The read/write data buses RWBS connect a plurality of internal-circuit-side I/O circuits 33 arranged to correspond to the memory cell arrays 10 to a plurality of external-circuit-side I/O circuits 36 arranged to correspond to the external I/O terminals 22. A read/write data bus RWBS is connected to a plurality of internal-circuit-side I/O circuits 33 for each bank. Since the read/write data buses RWBS extend from the internal-circuit-side I/O circuits 33 arranged near the memory cell array 10 of each of the banks to the external-terminal-side I/O circuits 36 arranged near the external I/O terminals 22, the length of each of the read/write data buses RWBS is approximately equal to the long side of the semiconductor chip of the semiconductor device 1. The plurality of the memory cell arrays 10 access (read or write) a read/write data bus RWBS in a mutually exclusive manner.

An external-terminal-side I/O circuit 36 is arranged for each of the external I/O terminals 22. Each of the external-terminal-side I/O circuits 36 includes: a read/write data bus interface section including a read data receiver (first receiver) RAMP, a read data latch RLAT, and a write data buffer WBF; a parallel-to-serial/serial-to-parallel conversion circuit 362; and an input/output buffer 361.

The read data receiver (first receiver) RAMP senses a small-amplitude signal transmitted through a corresponding read/write data bus RWBS when a read command is executed. While the reference voltage signal VREF is also connected to the read data receiver RAMP. The read data latch RLAT is a latch circuit temporarily holding data sensed by the read data receiver RAMP when a read command is executed. The write data buffer WBF includes: a latch circuit temporarily storing data converted from serial to parallel by the parallel-to-serial/serial-to-parallel conversion circuit 362; and a drive circuit outputting data held by the latch circuit to a corresponding read/write data bus RWBS as a small-amplitude signal.

The second transmission wiring VREF, the high-side internal power supply wiring VDL, and the low-side internal power supply wiring VSL included in a common reference voltage circuit 40 extend in parallel to the plurality of read/write data buses RWBS and supply power supplies to the plurality of internal-circuit-side I/O circuits 33 and read data receivers RAMP. This will be described in detail later with reference to FIG. 3. It is desirable that the semiconductor device 1 includes a plurality of internal-circuit-side drivers 41 each corresponding to one of the plurality of memory cell arrays 10 or one of the plurality of internal-circuit-side I/O circuits 33.

When a read command is executed, the parallel-to-serial/serial-to-parallel conversion circuit 362 converts data temporarily held by the read data latch RLAT from parallel to serial in synchronization with the signal DLLCLK and outputs the serial data to the I/O buffer 361. Further, when a write command is executed, the parallel-to-serial/serial-to-parallel conversion circuit 362 converts data supplied from the I/O buffer 361 into parallel data in synchronization with the signal DLLCLK and stores the parallel data in the latch circuit of the write data buffer WBF.

When a read command is executed, the I/O buffer 361 outputs serial data converted by the parallel-to-serial/serial-to-parallel conversion circuit 362 via the external I/O terminal 22. When a write command is executed, the I/O buffer 361 captures data inputted via the external I/O terminal 22 and transmits the data to the parallel-to-serial/serial-to-parallel conversion circuit 362. In synchronization with such data signal inputted to/outputted from the I/O buffer 361 via the external I/O terminal 22, a data strobe signal is also inputted/outputted via a DQS terminal (not illustrated).

Figure 3:
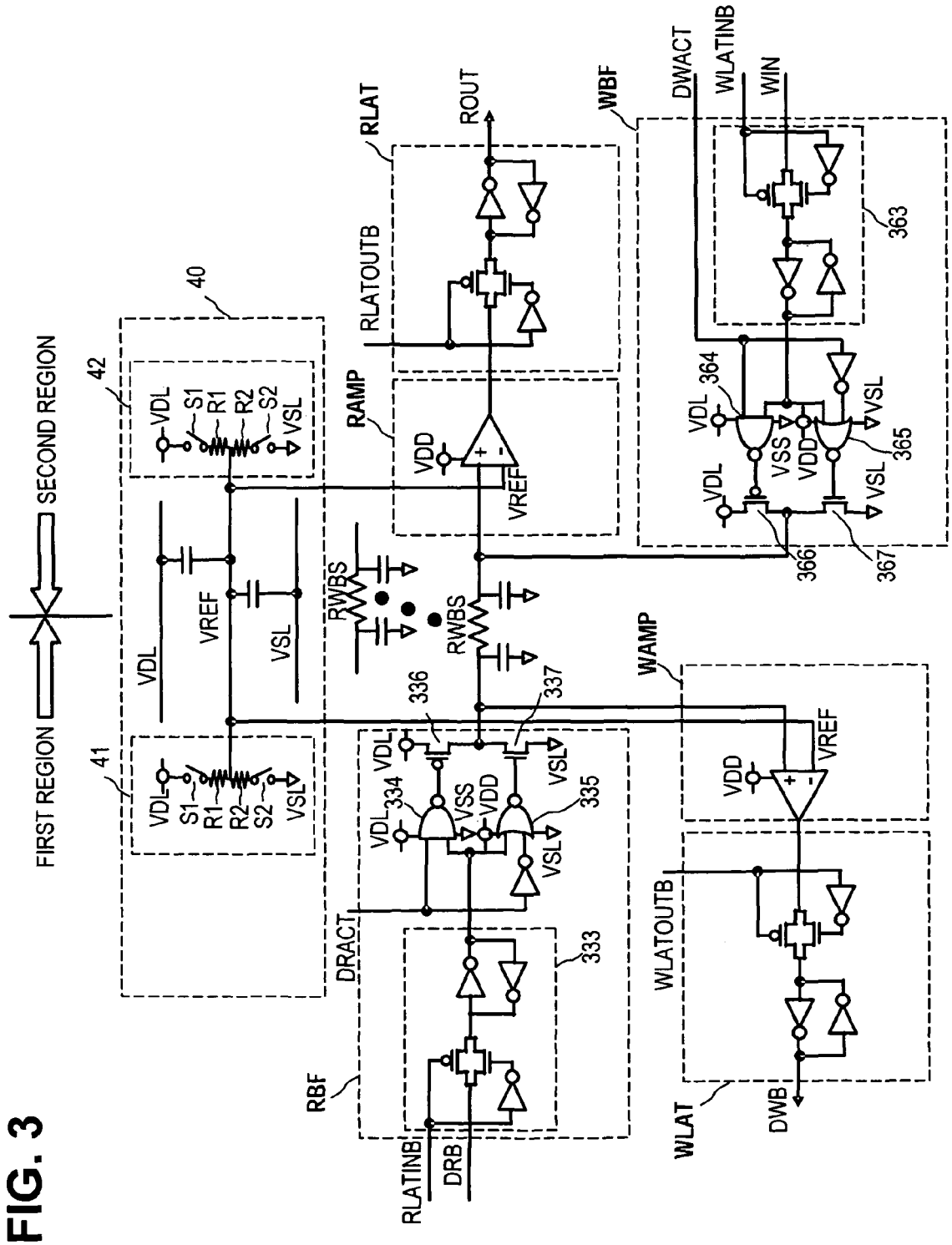
FIG. 3 is a block diagram of an internal-circuit-side data transmission circuit and an external-terminal-side data transmission circuit of the semiconductor device according to example 1.

FIG. 3 is a block diagram of an internal-circuit-side (first region) data transmission circuit and an external-terminal-side (second region) data transmission circuit of the semiconductor device 1 according to example 1. These data transmission circuits transmit a small-amplitude signal through a corresponding read/write data bus RWBS. Among the circuits illustrated in FIG. 3, regarding the circuits supplied with VDL and VSL as the power supplies thereof, which are used as the high- and low-side power supplies of the small-amplitude signal, respectively, the power supplies VDL and VSL are indicated for all the circuits. However, regarding the circuits supplied with the power supplies VDD and VSS, the power supplies VDD and VSS are not indicated for some of the circuits. Namely, among the circuits illustrated in FIG. 3, regarding the circuits of which power supplies are not specified, VDD and VSS are supplied as the power supplies. The voltage of the high-side power supply VDL is equal to or less than that of the power supply VDD, and the power supply VDL is an internal power supply generated inside the semiconductor device 1. Further, the voltage of the low-side power supply VSL is equal to or greater than that of the power supply VSS, and the power supply VSL is an internal power supply generated inside the semiconductor device 1.

In FIG. 3, the read data buffer RBF includes: a latch circuit 333; a pre-buffer circuit including a NAND circuit 334 and a NOR circuit 335; and a buffer circuit including a P-channel MOS transistor 336 and an N-channel MOS transistor 337. The latch circuit 333 captures a signal DRB outputted from the read/write amplifier RWAMP (see FIG. 2) when a latch signal RLATINB is at a low level. When the latch signal RLATINB is at a high level, the latch circuit 333 holds data. The NAND circuit 334, the NOR circuit 335, the P-channel MOS transistor 336, and the N-channel MOS transistor 337 function as a first driver. When a control signal DRACT is at a high level, the first driver outputs data held by the latch circuit 333 to the read/write data bus (first transmission wiring) RWBS as a small-amplitude signal. When the control signal DRACT is at a low level, both the P-channel MOS transistor 336 and the N-channel MOS transistor 337 are turned off. Thus, the read data buffer RBF is brought in an output high impedance state. Relatively large-sized transistors are used as the P-channel MOS transistor 336 and the N-channel MOS transistor 337, so that the small-amplitude signal can be transmitted through the read/write data bus RWBS at high speed.

In the read data buffer RBF, the NAND circuit 334 has a high-side power supply terminal connected to the internal power supply VDL and a low-side power supply terminal connected to the power supply VSS. Further, the NOR circuit 335 has a high-side power supply terminal connected to the power supply VDD and a low-side power supply terminal connected to the internal power supply VSL. Further, the P-channel MOS transistor 336 included in the buffer circuit has a source connected to the internal power supply VDL, and the N-channel MOS transistor 337 has a source connected to the internal power supply VSL. The high-side internal power supply VDL is equal to or less than the high-side power supply VDD and is generated inside the semiconductor device 1. The low-side internal power supply VSL is equal to or greater than the low-side power supply VSS and is generated inside the semiconductor device 1. The potentials of the high-side power supply VDD, the high-side internal power supply VDL, the low-side internal power supply VSL, and the low-side power supply VSS are represented by expression (1).

$$VDD \geq VDL > VSL \geq VSS \qquad \text{expression (1)}$$

Since the P-channel MOS transistor 336 and the N-channel MOS transistor 337 included in the first driver circuit have a source connected to the power supplies VDL and VSL, respectively, a signal outputted from the read data buffer circuit RBF to the read/write data bus RWBS has a small amplitude with a high-side level VDL and a low-side level VSL. Thus, the signal has a smaller amplitude, compared with a signal outputted from a driver circuit connected to the power supplies VDD and VSS. Thus, since the charging/discharging current of the read/write data bus RWBS can be reduced and the amplitude can be decreased, high-speed signal transmission can be achieved.

Further, since the low-side power supply of the NAND circuit 334 is connected to VSS and the high-side power supply of the NOR circuit 335 is connected to VDD, even if the electric potential difference between VDL and VSL is small, as long as the electric potential difference between VDD and VSL and the electric potential difference between VDL and VSS exceed the transistor threshold voltages of the P-channel MOS transistor 336 and the N-channel MOS transistor 337, respectively, the first driver including the P-channel MOS transistor 336 and the N-channel MOS transistor 337 operates. Thus, the signal transmitted through the read/write data bus RWBS can have a small amplitude.

The common reference voltage circuit 40 includes an internal-circuit-side reference voltage circuit 41 outputting the reference voltage signal VREF on the internal circuit side and an external-terminal-side reference voltage circuit 42 outputting the reference voltage signal VREF on the external terminal side. Each of the internal-circuit-side reference voltage circuit 41 and the external-terminal-side reference voltage circuit 42 includes: a switch S1 connected to the high-side internal power supply VDL; a switch S2 connected to the low-side internal power supply VSL; a resistor R1 connected between the second transmission wiring VREF transmitting the reference voltage VREF and the switch S1; and a resistor R2 connected between the second transmission wiring VREF and the switch S2. The resistors R1 and R2 have approximately equal resistance values, which are equal to or greater than 1 kΩ and are relatively high. Since the resistors 121 and R2 have approximately equal resistance values, when the switches S1 and S2 are closed, the reference voltage VREF transmitted through the second transmission wiring VREF can be roughly represented by expression (2).

$$VREF=\frac{1}{2}(VDL+VSL) \qquad \text{expression (2)}$$

The read data receiver (first receiver) RAMP has a non-inverted signal input terminal connected to the read/write data bus (first transmission wiring) RWBS and an inverted signal input terminal connected to the second transmission wiring VREF. The read data receiver (first receiver) RAMP functions as a differential circuit comparing a small-amplitude signal transmitted through the read/write data bus RWBS with the reference voltage signal VREF transmitted through the second transmission wiring. An output signal from the differential circuit is connected to the read data latch RLAT, and when a control signal RLATOUTB is at a low level, the read data latch RLAT captures the output signal. When the control signal RLATOUTB is at a high level, the read data latch RLAT holds the data. An output signal ROUT from the read data latch RLAT is connected to a parallel-to-serial conversion circuit (parallel-to-serial conversion unit of the parallel-to-serial/serial-to-parallel conversion circuit 362 in FIG. 2).

The write data buffer WBF includes: a latch circuit 363; a pre-buffer circuit including a NAND circuit 364 and a NOR circuit 365; and a buffer circuit including a P-channel MOS transistor 366 and an N-channel MOS transistor 367. The latch circuit 363 captures a signal WIN, which is data converted from serial to parallel by the parallel-to-serial/serial-to-parallel conversion circuit 362 of FIG. 2, when a latch timing control signal WLATINB is at a low level. The latch circuit 363 holds captured data, when the latch timing control signal WLATINB is at a high level.

The NAND circuit 364, the NOR circuit 365, the P-channel MOS transistor 366, and the N-channel MOS transistor 367 function as a third driver circuit. The third driver circuit outputs write data captured by the latch circuit 363 to the read/write data bus RWBS as a small-amplitude signal, when a control signal DWACT is at a high level. When the control signal DWACT is at a low level, both the P-channel MOS transistor 366 and the N-channel MOS transistor 367 are turned off, and the write data buffer WBF is brought in an output high impedance state.

In the write data buffer WBF, the NAND circuit 364 has a high-side power supply terminal connected to the internal power supply VDL and a low-side power supply terminal connected to the power supply VSS. Further, the NOR circuit 365 has a high-side power supply terminal connected to the power supply VDD and a low-side power supply terminal connected to the power supply VSL. Further, the P-channel MOS transistor 366 included in the buffer circuit has a source connected to the internal power supply VDL, and the N-channel MOS transistor 367 has a source connected to the internal power supply VSL.

Since the P-channel MOS transistor 366 and the N-channel MOS transistor 367 included in the third driver circuit have a source connected to the power supplies VDL and VSL, respectively, a signal outputted from the write data buffer circuit WBF to the read/write data bus RWBS has a small amplitude with a high-side level VDL and a low-side level VSL. Thus, the signal has a smaller amplitude, compared with a signal outputted from a driver circuit connected to the power supplies VDD and VSS. Thus, since the charging/discharging current of the read/write data bus RWBS can be reduced and the amplitude can be decreased, high-speed signal transmission can be achieved.

Further, since the low-side power supply of the NAND circuit 364 is connected to VSS and the high-side power supply of the NOR circuit 365 is connected to VDD, even if the electric potential difference between VDL and VSL is small, as long as the electric potential difference between VDD and VSL and the electric potential difference between VDL and VSS exceed the transistor threshold voltages of the P-channel MOS transistor 366 and the N-channel MOS transistor 367, respectively, the third driver including the P-channel MOS transistor 366 and the N-channel MOS transistor 367 operates. Thus, the signal transmitted through the read/write data bus RWBS can have a small amplitude.

The write data receiver WAMP has a non-inverted signal input terminal connected to the read/write data bus (first transmission wiring) RWBS and an inverted signal input terminal connected to the second transmission wiring VREF. The write data receiver WAMP functions as a differential circuit comparing a small-amplitude signal transmitted through the read/write data bus RWBS with the reference voltage signal VREF transmitted through the second transmission wiring. An output signal from the differential circuit is connected to the write data latch WLAT, and when a control signal WLATOUTB is at a low level, the write data latch WLAT captures the output signal. When the control signal WLATOUTB is at a high level, the write data latch WLAT holds the data. An output signal DWB from the write data latch WLAT is connected to the read/write amplifier RWAMP (see FIG. 2).

The read/write data buses (first transmission wirings) RWBS and the second transmission wiring VREF are connected to the internal-circuit-side I/O circuits 33 and external-terminal-side I/O circuits 36 (see FIG. 2). It is desirable that the external-terminal-side reference voltage circuit 42 be arranged near the external-terminal-side I/O circuits 36 and the internal-circuit-side reference voltage circuit 41 be arranged near or beyond the internal-circuit-side I/O circuit 33 arranged at a position farthest from the external-terminal-side I/O circuits 36 along the first transmission wirings RWBS and the second transmission wiring VREF. The internal-circuit-side reference voltage circuit 41 may be arranged near the internal-circuit-side I/O circuits 33 each arranged per bank.

The second transmission wiring VREF is arranged between the internal power supply wirings VDL and VSL from the internal-circuit-side I/O circuits 33 to the external-terminal-side I/O circuits 36. In this way, both the interwiring capacitance between the internal power supply wiring VDL and the second transmission wiring VREF and the interwiring capacitance between the internal power supply wiring VSL and the second transmission wiring VREF have large values.

On the other hand, each of the first transmission wirings RWBS is arranged away from the internal power supply wirings VDL and VSL, so that signal transmission through the first transmission wirings RWBS does not affect the internal power supply wirings VDL and VSL. It is only necessary to separate the internal power supply wirings VSL and VDL from the first transmission wirings RWBS, as long as transmission of the small-amplitude signal transmitted through each of the first transmission wirings RWBS does not significantly affect potentials of the internal power supply wirings VDL and VSL because of the interwiring capacitance or the mutual inductance.

Figure 4:
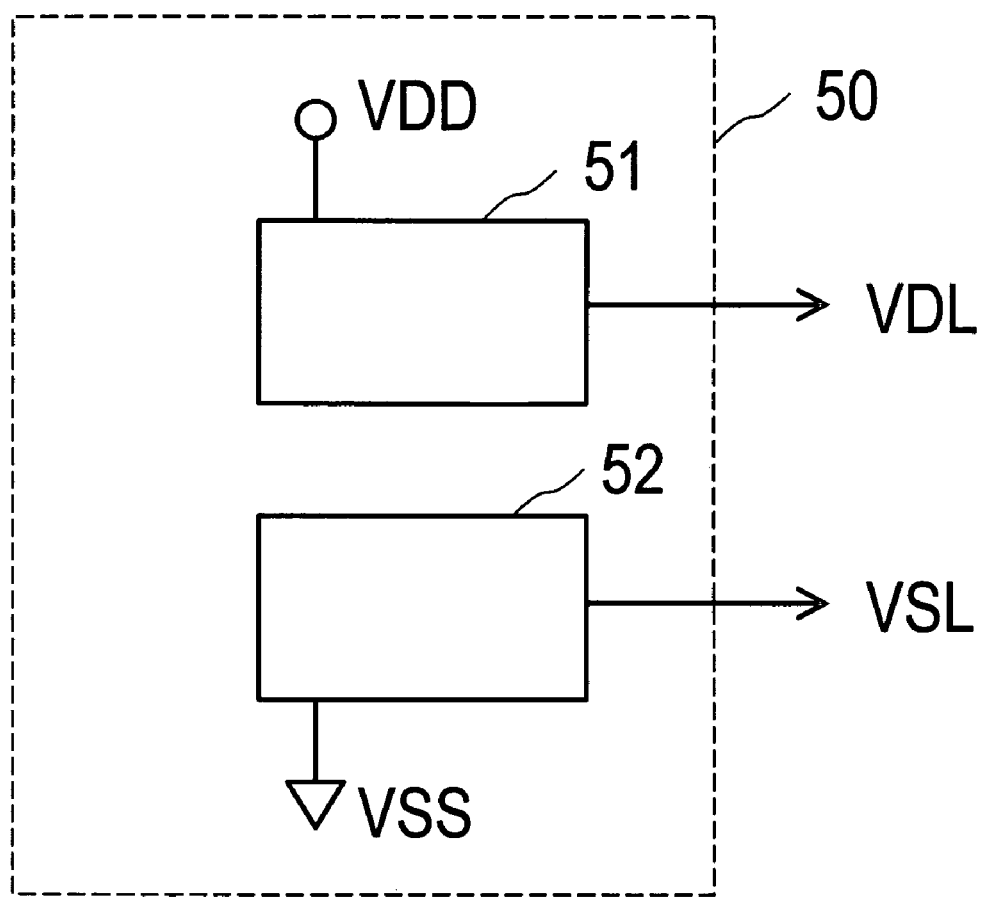
FIG. 4 is a block diagram of an internal power supply generation circuit according to example 1.

FIG. 4 is a block diagram of the internal power supply generation circuit 50 generating the internal power supplies VDL and VSL according to example 1. The internal power supply generation circuit 50 is arranged in the semiconductor device 1 and generates the internal high- and low-side power supplies VDL and VSL from the high- and low-side power supplies VDD and VSS supplied from the outside, respectively. In FIG. 4, a first internal power supply generation circuit 51 uses the power supply VDD to generate the internal high-side power supply VDL, and a second internal power supply generation circuit 52 uses the power supply VSS to generate the internal low-side power supply VSL. The configuration of the internal power supply generation circuit 50 illustrated in FIG. 4 is an example. An arbitrary circuit may be used, as long as the circuit can generate the power supplies VDL and VSL satisfying the above expression (1), with respect to the potentials of the power supplies VDD and VSS used in the internal circuit of the semiconductor device 1.

Figure 5:
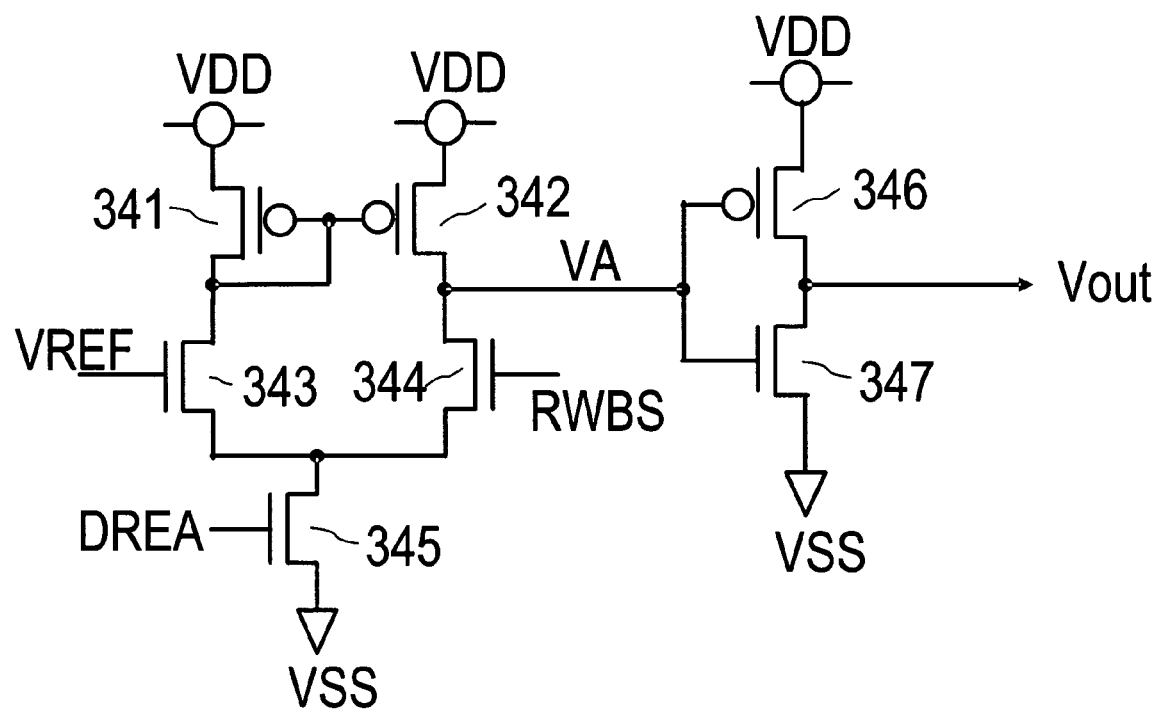
FIG. 5 is a circuit block diagram of a data receiver according to example 1.

FIG. 5 is a circuit block diagram of a data receiver as an example of the read data receiver (first receiver) RAMP and the write data receiver (second receiver) WAMP of FIG. 3. While a different control signal is used, the data receiver circuit of FIG. 5 can be used as the read data receiver RAMP or the write data receiver WAMP. The data receiver of FIG. 5 includes: a differential circuit including an N-channel MOS transistor 345 as a current supply, N-channel MOS transistors 343 and 344 as a differential pair, and P-channel MOS transistors 341 and 342 as a load circuit; and an output circuit including a P-channel MOS transistor 346 and an N-channel MOS transistor 347. Based on the above configuration, even when the electric potential difference between the reference voltage signal VREF and the read/write data bus RWBS is small, the data receiver can perform conversion to obtain a digital signal having an amplitude between the power supplies VDD and VSS and can output the signal from an output terminal Vout.

As described with FIG. 3, the second transmission wiring VREF is arranged between the internal power supply wirings VDL and VSL, and each of the first transmission wirings RWBS is arranged away from the internal power supply wirings VDL and VSL. The reason why the second transmission wiring VREF is arranged between the internal power supply wirings VDL and VSL as illustrated in FIG. 3 will be hereinafter described with reference to FIGS. 6 and 20. In FIGS. 2 and 3, depending on arrangement of the memory cell arrays 10 with respect to the data I/O terminals 22 on the semiconductor chip 1, the internal-circuit-side I/O circuits 33 arranged near the memory cell arrays 10 and the external-terminal-side I/O circuits 36 arranged near the data I/O terminals 22 may be arranged far from each other. In such case, each of the plurality of first transmission wirings RWBS and the second transmission wiring VREF connecting the internal-circuit-side I/O circuits 33 and the external-terminal-side I/O circuits 36 need to have a substantial length. The length of each of these transmission wirings may be equal to or greater than the long side of the semiconductor chip 1. In particular, since the first transmission wirings RWBS need to transmit read/write data at high speed, the P-channel MOS transistor 336 and the N-channel MOS transistor 337 included in the first driver and the P-channel MOS transistor 366 and the N-channel MOS transistor 367 included in the third driver need to have a low output impedance. Further, since the first transmission wirings RWBS are formed by 8 to 128 wirings and transmit 8-to-128 bit data in parallel, depending on the data outputted to the first transmission wirings RWBS, potentials of the internal power supplies VDL and VSL fluctuate to some extent. Even when the potentials of the internal power supplies VDL and VSL fluctuate, since the first driver (336 and 337) and the third driver (366 and 367) have a relatively low impedance, these drivers quickly respond to the potential fluctuations of the internal power supplies VDL and VSL. Thus, the potential of the small-amplitude signal transmitted through each of the first transmission wirings RWBS is reflected by the potential fluctuations of the internal power supplies VDL and VSL.

On the other hand, since the second transmission wiring VREF transmits a reference voltage signal, which basically does not exhibit potential fluctuations, the second driver 41 and the fourth driver 42 do not need to have a low output impedance. Further, since the second transmission wiring VREF needs to maintain the midpoint potential VREF during a stand-by state and the power consumption needs to be reduced, the second driver 41 and the fourth driver 42 have a relatively high output impedance. Therefore, when the voltages of the internal power supplies VDL and VSL fluctuate, the potential of the second transmission wiring VREF does not respond quickly. Namely, when the potentials of the internal power supplies VDL and VSL fluctuate, the potential of the small-amplitude signal transmitted through the first transmission wiring quickly responds to the fluctuation. However, since the potential of the second transmission wiring VREF does not fluctuate quickly, the voltage margin of the first receiver RAMP and the second receiver WAMP is reduced. In addition, if the amplitude of the small-amplitude signal is reduced to realize high speed transmission and low power consumption, potential fluctuations of the internal power supplies VDL and VSL may cause malfunctions.

Figure 20:
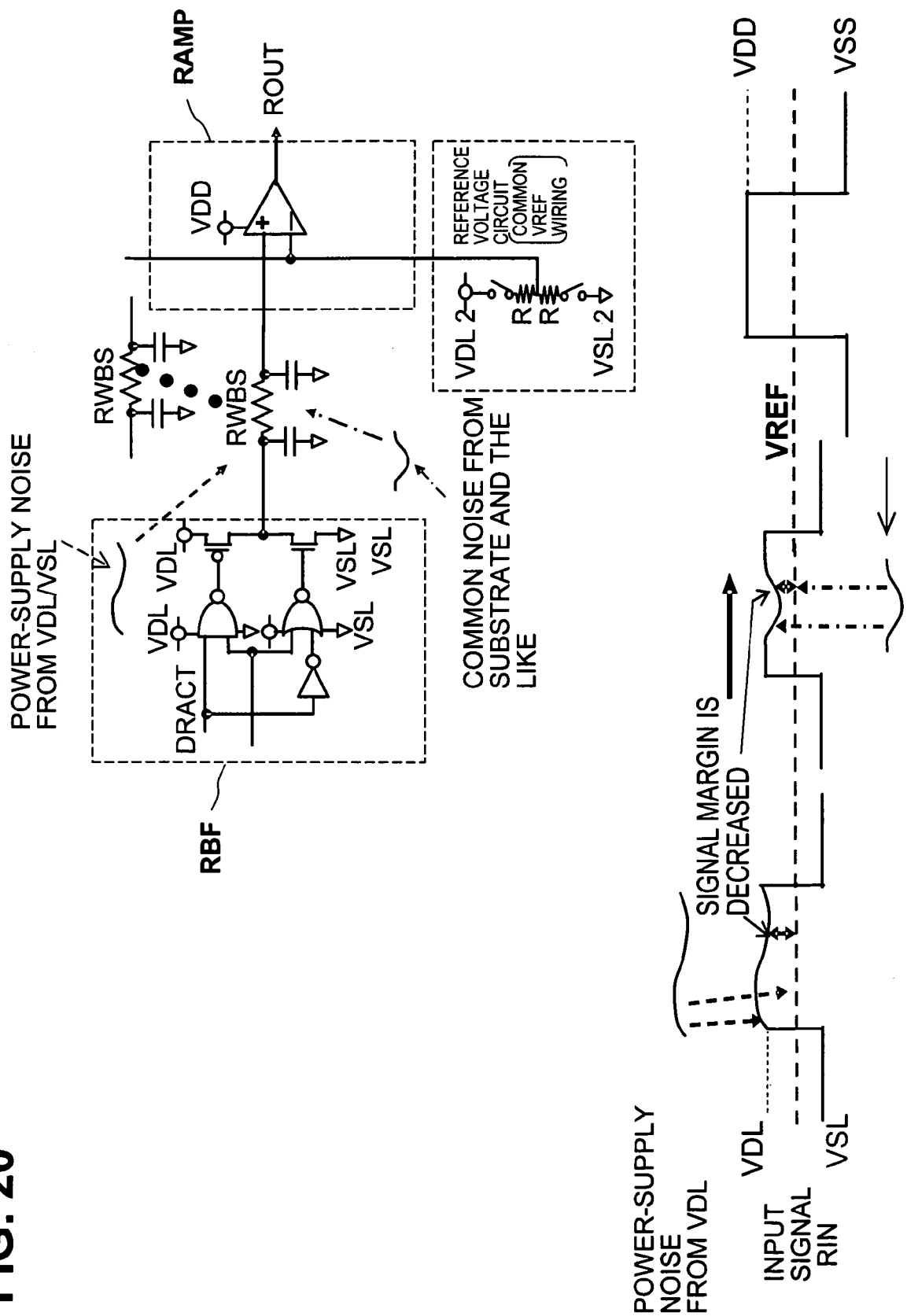
FIG. 20 illustrates operations of a comparative example compared with example 1.

FIG. 20 is a block diagram of a comparative example. In this comparative example, the second driver generates the reference voltage VREF from other power supplies VDL2 and VSL2, which do not have a common impedance with the internal power supplies VDL and VSL of the first driver and which have the same voltages as VDL and VSL. In addition, in the comparative example, the second driver supplies the reference voltage VREF to the first receiver, and no capacitance is provided between the reference voltage VREF and the internal power supply VDL and between the reference voltage VREF and the internal power supply VSL. In FIG. 20, potentials of the internal power supplies VDL and VSL fluctuate because of power-supply noises. This potential fluctuation affects the voltage level of the small-amplitude signal transmitted through the first transmission wiring RWBS. Further, while being transmitted through the first transmission wiring RWBS, the small-amplitude signal is affected by common noises from the semiconductor substrate or the like.

On the other hand, assuming that the reference voltage VREF is not affected by fluctuations of the internal power supplies VDL and VSL and common noises from the substrate or the like unlike the small-amplitude signal transmitted through the first transmission wiring RWBS, if the voltage of the small-amplitude signal is affected by voltage fluctuations of the internal power supplies VDL and VSL or common noises from the semiconductor substrate or the like, the signal margin is accordingly reduced.

Figure 6:
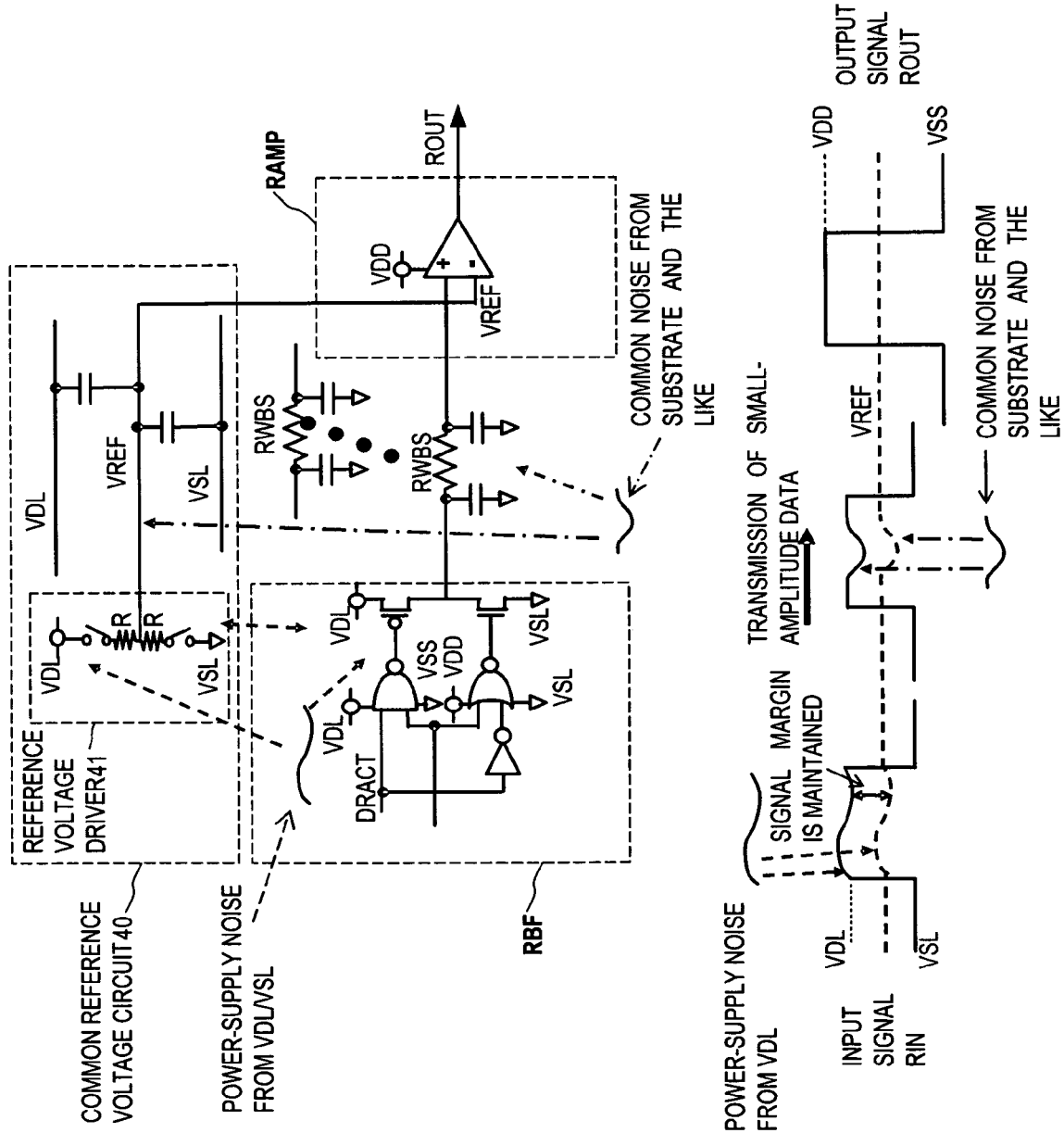
FIG. 6 illustrates a preferable layout according to example 1.

In contrast, according to example 1, as illustrated in FIGS. 3 and 6, since the second transmission wiring VREF is arranged between the internal power supply wirings VDL and VSL, the interwiring capacitance between the second transmission wiring VREF and the internal power supply wiring VDL and the interwiring capacitance between the second transmission wiring VREF and the internal power supply wiring VSL are increased. If the potential of the internal power supply VDL and/or the internal power supply VSL fluctuates, because of the interwiring capacitance, the potential of the second transmission wiring VREF fluctuates in the same direction. Thus, while output impedances of the second and fourth drivers 41 and 42 are higher than those of the first driver (336 and 337) and the third driver (366 and 367) and the second and fourth drivers 41 and 42 do not quickly respond to voltage fluctuations of the internal power supplies VDL and VSL, because of the interwiring capacitances of the internal power supplies VDL and VSL, the potential fluctuation of the reference voltage signal VREF transmitted through the second transmission wiring can follow the voltage fluctuations of the internal power supplies VDL and VSL.

Further, as illustrated in FIG. 6, it is preferable that the second driver 41 connected to the second transmission wiring VREF be arranged near the first driver RBF connected to the first transmission wirings RWBS and the wiring impedance of the internal power supply wirings VDL and VSL between the first driver RBF and the second driver 41 be minimized. In this way, fluctuations of the internal power supplies VDL and VSL by the first driver RBF are directly represented as voltage fluctuations of the second transmission wiring VREF via the second driver.

Further, the second driver 41 may be arranged far from the first receiver RAMP beyond the first driver RBF, and the first driver RBF may be arranged somewhere along the second transmission wiring VREF and the internal power supply wirings VDL and VSL sandwiching the second transmission wiring VREF. In this way, even if the first driver RBF is affected by fluctuations of the internal power supply VDL/VSL or if the first transmission wiring RWBS is affected by common noises from the substrate or the like, the internal power supply VDL/VSL and the second transmission wiring VREF can be affected in the same way. As a result, a sufficient signal margin can be ensured.

With FIG. 6, a preferable layout of the first driver RBF, the second driver 41, and the first receiver RAMP has been described. However, the same applies to the third driver WBF, the fourth driver 42, and the second receiver WAMP. Arranged in this way, with respect to fluctuations of the internal power supplies VDL and VSL, the operating margin of the first receiver RAMP and the second receiver WAMP can be increased, thereby reducing the possibility of malfunctions. In addition, by further reducing the amplitude of the signal transmitted through the first transmission wiring RWBS, charging/discharging current flowing through the first transmission wiring RWBS can be decreased. As a result, the power consumption can be reduced further, and higher speed signal transmission can be realized.

Further, by arranging the second transmission wiring VREF between the internal power supplies VDL and VSL, the interwiring capacitance between the internal power supply VDL and the second transmission wiring VREF and the interwiring capacitance between the internal power supply VSL and the second transmission wiring VREF can be made substantially equal. In this way, if the power supply voltage of either the internal power supply VDL or VSL fluctuates, the potential of the reference voltage signal VREF transmitted through the second transmission wiring can follow the fluctuation. Further, by arranging the second transmission wiring between the internal power supply wirings VDL and VSL, the second transmission wiring VREF can be shielded from noises from internal wirings other than the internal power supply wirings VDL and VSL or external wirings, thereby further reducing the possibility of malfunctions.

Figure 7A:
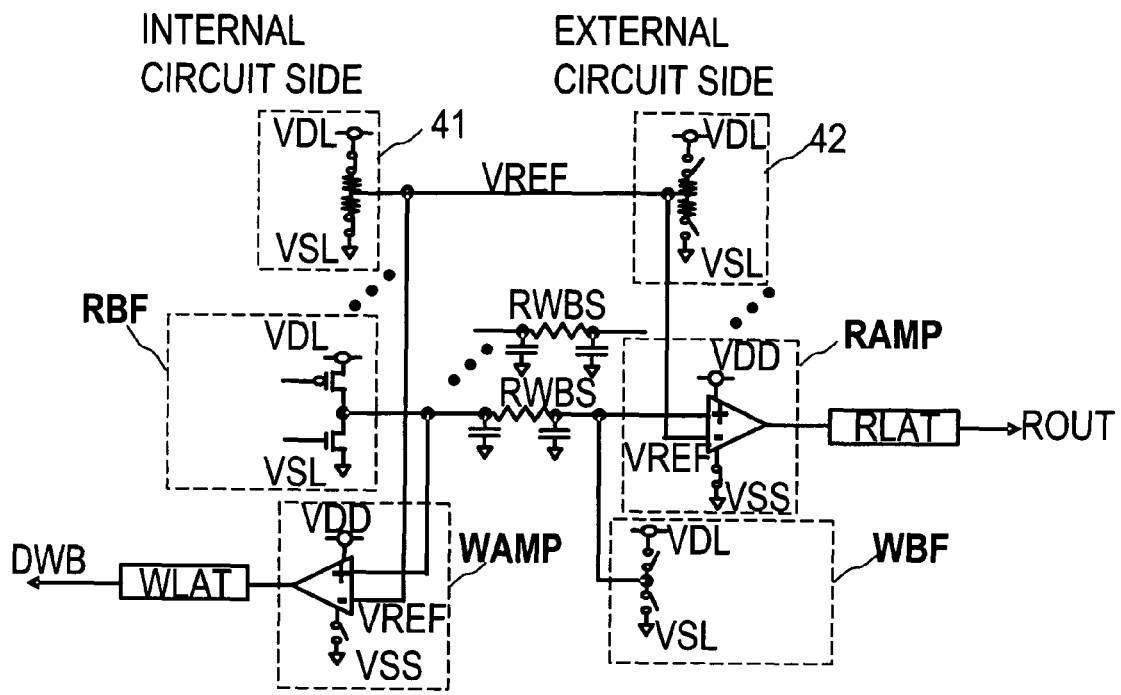
FIG. 7A illustrates states of driver circuits when data is outputted from the internal circuit side to the external terminal side according to example 1 (during a read operation)
Figure 7B:
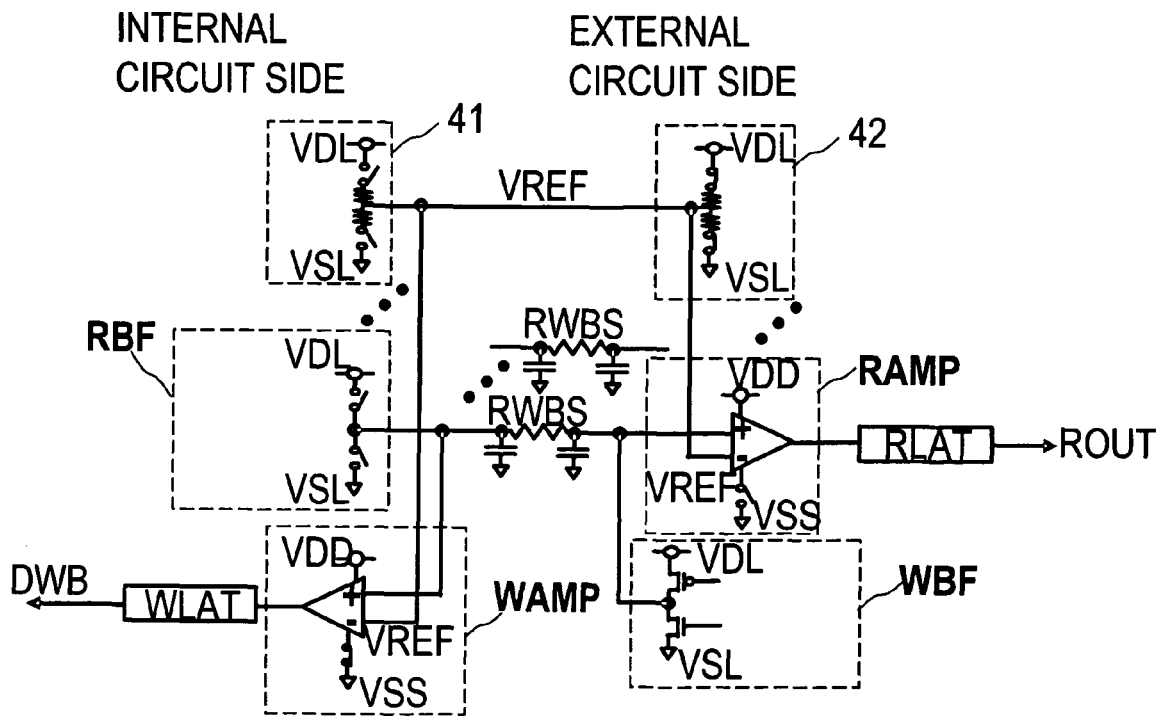
FIG. 7B illustrates states of the driver circuits when data is inputted from the external terminal side to the internal circuit side according to example 1 (during a write operation).

FIG. 7A illustrates states of driver circuits when data is transmitted from the internal circuit side to the external terminal side (when a read command is executed), and FIG. 7B illustrates states of the driver circuits when data is transmitted from the external terminal side to the internal circuit side (when a write command is executed). As illustrated in FIG. 7A, when data is transmitted from the internal circuit side to the external terminal side, the first driver RBF and the second driver 41 establish continuity and the third driver WBF and the fourth driver 42 are brought in an output high impedance state. Thus, the small-amplitude signal transmitted through the first transmission wiring RWBS and the reference voltage signal transmitted through the second transmission wiring VREF are outputted from the internal circuit side to the external terminal side. The first receiver RAMP on the external terminal side determines the voltage level of the small-amplitude signal, based on the reference voltage signal VREF outputted from the internal-circuit-side I/O circuit. During this operation, the second receiver WAMP on the internal circuit side is not activated.

As illustrated in FIG. 7B, when data is transmitted from the external terminal side to the internal circuit side (when a write command is executed), the third driver WBF and the fourth driver 42 establish continuity and the first driver RBF and the second driver 41 are brought in an output high impedance state. Thus, the small-amplitude signal transmitted through the first transmission wiring RWBS and the reference voltage signal transmitted through the second transmission wiring VREF are outputted from the external terminal side to the internal circuit side. The second receiver WAMP on the internal circuit side determines the voltage level of the small-amplitude signal, based on the reference voltage signal VREF outputted from the external-terminal-side I/O circuit. During this operation, the first receiver RAMP on the external terminal side is not activated.

Figure 8A:
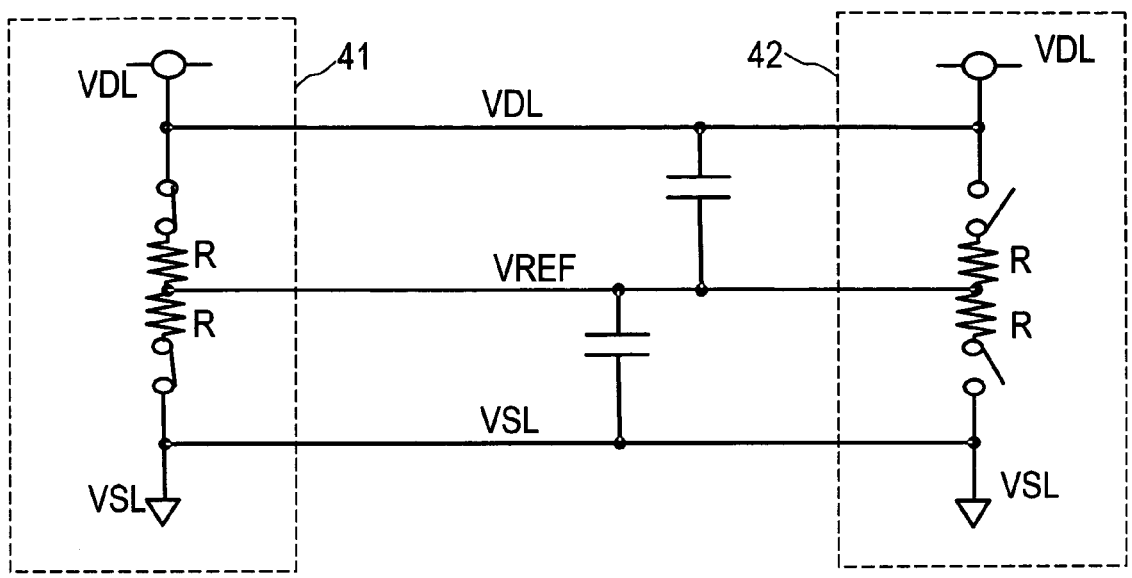
FIGS. 8A and 8B illustrate states of reference voltage drivers during read and write operations, respectively, according to example 1.
Figure 8B:
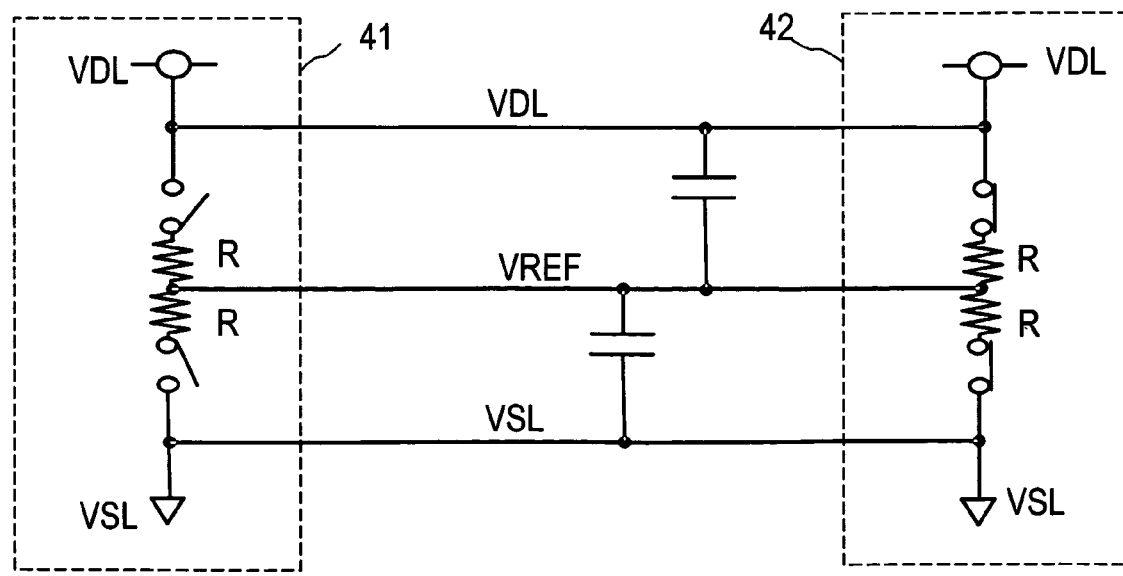

FIGS. 8A and 8B illustrate states of the reference voltage drivers (second and fourth drivers) 41 and 42 during read and write operations, respectively, according to example 1. As illustrated in FIG. 8A, during a read operation, while the internal-circuit-side driver (second driver) 41 establishes continuity, the external-terminal-side driver (fourth driver) 42 is brought in an output high impedance state. In conjunction with the read data transmitted through the first transmission wiring, the second transmission wiring also transmits the reference voltage VREF from the internal circuit side to the external terminal side.

On the other hand, as illustrated in FIG. 8B, during a write operation, while the external-terminal-side driver (fourth driver) 42 establishes continuity, the internal-circuit-side driver (second driver) 41 is brought in an output high impedance state. In conjunction with the write data transmitted through the first transmission wiring, the second transmission wiring also transmits the reference voltage VREF from the external terminal side to the internal circuit side.

Based on the above operations, when data is transmitted from the internal circuit side to the external terminal side, fluctuations of the internal power supplies VDL and VSL on the internal circuit side outputting the data can be reflected on the reference voltage VREF of the receiver (first receiver) on the external terminal side receiving the data. On the other hand, when data is transmitted from the external terminal side to the internal circuit side, fluctuations of the internal power supplies VDL and VSL on the external terminal side outputting the data can be reflected on the reference voltage VREF of the receiver (second receiver) on the internal circuit side receiving the data.

Example 2

In example 2, each of the external-terminal-side driver and the internal-circuit-side driver includes a plurality of switches. The switches separate the corresponding driver from the internal power supply wirings VDL and VSL. In this way, fluctuations of the data-output-side internal power supplies VDL and VSL either on the internal circuit side or the external terminal side can be reflected more accurately as fluctuations of the data-input-side reference voltage signal VREF.

Figure 9A:
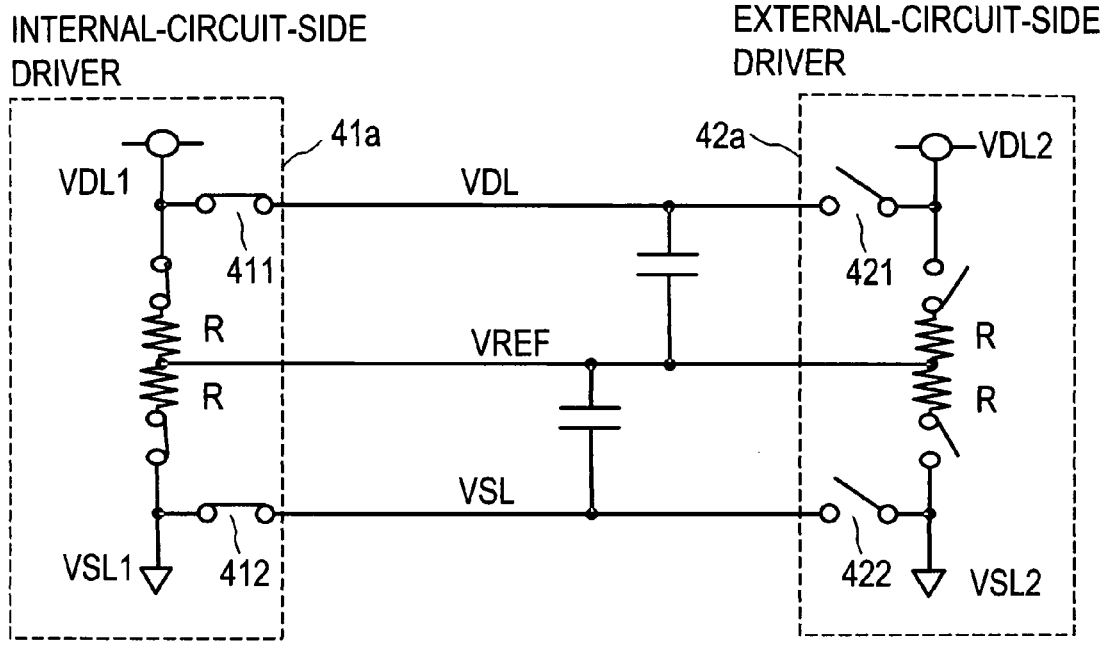
FIGS. 9A and 9B illustrate states of reference voltage drivers during read and write operations, respectively, according to example 2.

FIG. 9A illustrates operations of an internal-circuit-side reference voltage driver (second driver) 41a and an external-terminal-side reference voltage driver 42a when data is outputted from the internal circuit side to the external terminal side (when read data is outputted). Unlike the reference voltage drivers 41 and 42 (see FIGS. 3 and 8) of example 1, in example 2, the reference voltage drivers 41a includes switches 411 and 412 to separate internal power supplies VDL1 and VSL1 from the internal power supply wirings VDL and VSL. Similarly, the reference voltage drivers 42a includes switches 421 and 422 to separate internal power supplies VDL2 and VSL2 from the internal power supply wirings VDL and VSL. When data is transmitted from the internal circuit side to the external terminal side (when read data is outputted), the external-terminal-side reference voltage driver 42a is brought in an output high impedance state. In addition, by opening the switches 421 and 422, the internal power supply terminals VDL2 and VSL2 of the external-terminal-side reference voltage driver 42a are separated from the internal power supply wirings VDL and VSL. On the other hand, by closing the switches 411 and 412 of the internal-circuit-side reference voltage driver 41a, the internal power supply terminals VDL1 and VSL1 of the reference voltage driver 41a are connected to the internal power supply wirings VDL and VSL via the switches 411 and 412. Thus, the power supply wirings VDL and VSL have voltages that reflect more accurately the internal power supply voltages VDL1 and VSL1 on the data output side (internal circuit side). In addition, because of the interwiring capacitance among the power supply wirings VDL and VSL and the reference voltage signal VREF, the reference voltage signal VREF has a voltage that reflects more accurately the internal power supply voltages VDL1 and VSL1 of the driver circuit on the internal circuit side outputting the data.

Figure 9B:
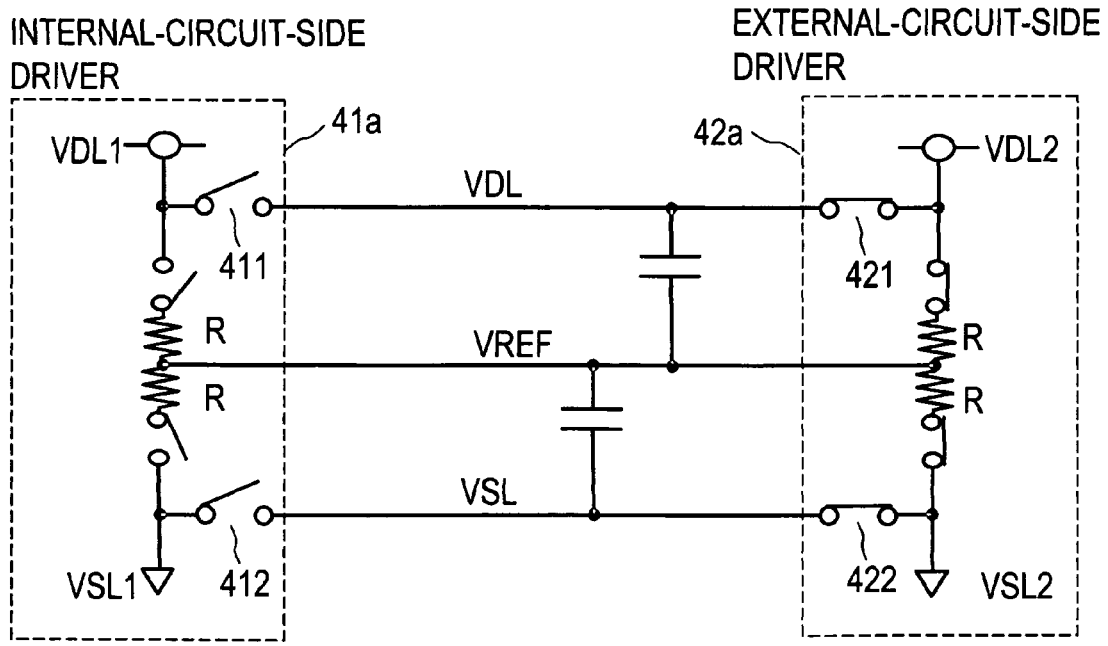

In addition, as illustrated in FIG. 9B, when data is transmitted from the external terminal side to the internal circuit side (when write data is inputted), the switches 421 and 422 are turned on and the switches 411 and 412 are turned off. While the internal-circuit-side reference voltage driver 41a is brought in an output high impedance state, based on the above setting, the internal power supply terminals VDL1 and VSL1 of the internal-circuit-side reference voltage driver 41a are separated from the internal power supply wirings VDL and VSL. The internal power supply terminals VDL2 and VSL2 of the reference voltage driver 42a are connected to the internal power supply wirings VDL and VSL via the switches 421 and 422. Thus, the power supply wirings VDL and VSL have voltages that reflect more accurately the internal power supply voltages VDL2 and VSL2 on the data output side (external terminal side). In addition, because of the interwiring capacitance among the power supply wirings VDL and VSL and the reference voltage signal VREF, the reference voltage signal VREF has a voltage that reflects more accurately the internal power supply voltages VDL2 and VSL2 of the driver circuit on the external terminal side outputting the data.

The configuration and operation of example 2 are the same as those of example 1, excepting that the switches 411, 412, 421, and 422 are arranged and excepting that the internal power supplies of the data-input-side driver, that is, the internal power supplies VDL1 and VSL1 of the internal-circuit-side driver or the internal power supplies VDL2 and VSL2 of the external-terminal-side driver, are separated from the internal power supply wirings VDL and VSL. Thus, repetitive descriptions will be omitted.

In addition, in example 2, the internal voltage generation circuit 50 (see FIG. 4) may be arranged on the external terminal side and the internal circuit side. More specifically, the internal voltage generation circuit 50 arranged on the internal circuit side may supply the internal power supplies VDL1 and VSL1 to the first driver (336 and 337 in FIG. 3) and the second driver 41a on the internal circuit side, and the internal voltage generation circuit 50 arranged on the external terminal side may supply the internal power supplies VDL2 and VSL2 to the third driver (366 and 367 in FIG. 3) and the fourth driver 42a on the external circuit side. The internal power supply wirings VDL and VSL may be supplied with the internal reference voltages generated by the internal voltage generation circuit 50 arranged on the data output side, among the internal power supplies VDL1, VSL1, VDL2, and VSL2.

Figure 11:
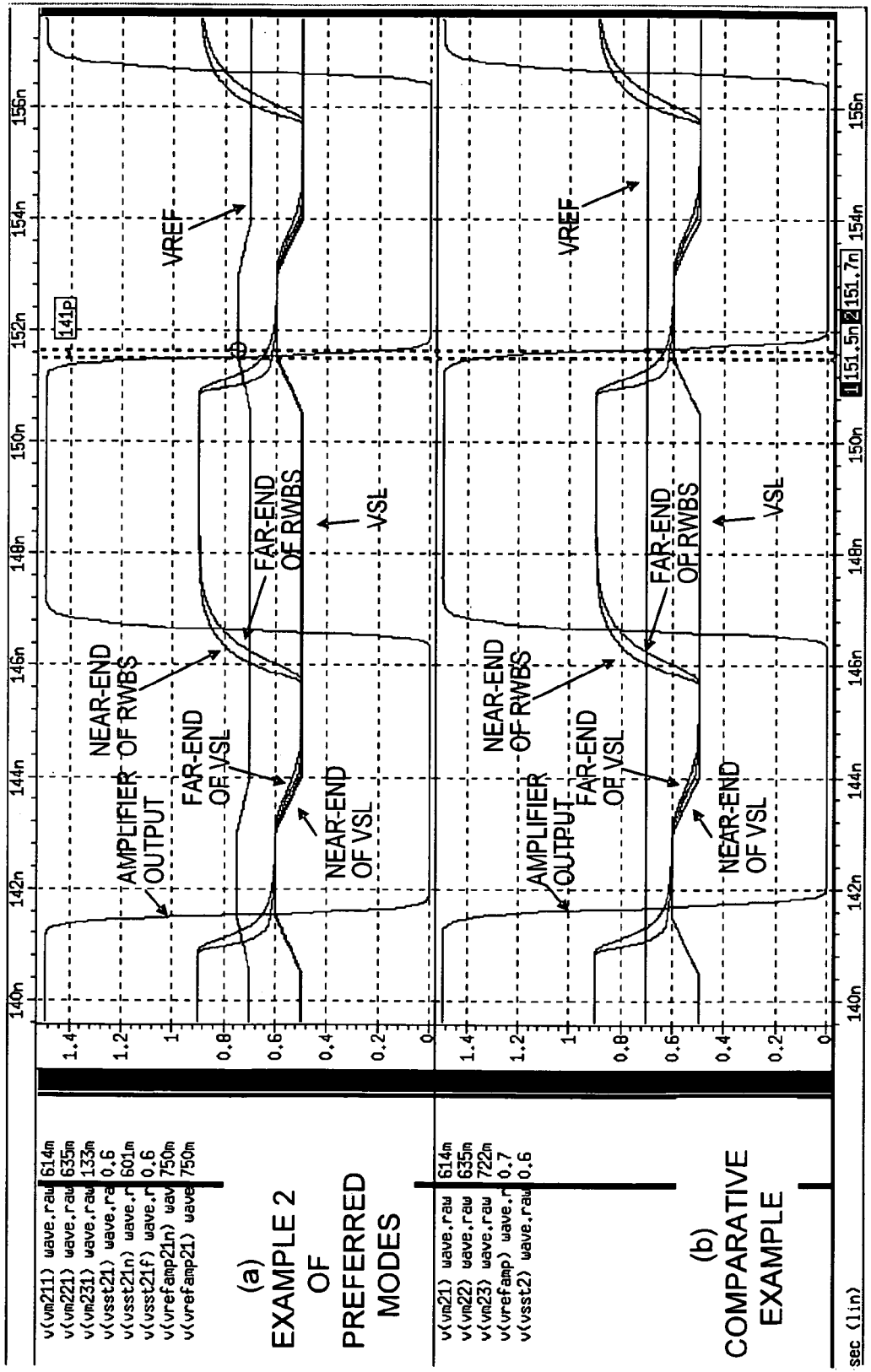
FIG. 11 illustrates simulation waveforms of transmission wirings according to example 2 of preferred modes and a comparative example, respectively, when an internal power supply VSL fluctuates.

FIG. 11 illustrates simulation waveforms of signals transmitted through transmission wirings according to example 2 of preferred modes and a comparative example, respectively, when the internal power supply VSL fluctuates. In (a) the example 2 of preferred modes of FIG. 11, the second transmission wiring VREF and the low-side internal power supply wiring VSL are arranged close to each other, and the interwiring capacitance between the second transmission wiring VREF and the internal power supply wiring VSL is set to be large. On the other hand, in (b) the comparative example of FIG. 11, no interwiring capacitance is provided between the second transmission wiring VREF and the internal power supply wiring VSL.

In FIG. 11, the vertical axis represents voltage (V) and the horizontal axis represents time (ns). The power supplies are set as follows: VDD=1.5 V, VSS=0 V, VSL=0.5 V, VDL=0.9 V, and VREF=0.7 V. However, the power supply VSL is not completely fixed at 0.5 V. The power supply VSL is floated up to 0.6 V in conjunction with the circuit operation (see time around 152 ns, for example). In (a) the example 2 of FIG. 11, because of the interwiring capacitance between VSL and VREF, the second transmission wiring VREF fluctuates between 0.7 V and 0.75 V in conjunction with the fluctuation of VSL.

Assuming that the low level voltage transmitted through the first transmission wiring RWBS is VRWBS(L), originally, the signal amount (the voltage margin between the low level voltage transmitted through the first transmission wiring and the reference voltage transmitted through the second transmission wiring) can be represented by expression (3).

$$\text{VREF}-\text{VRWBS}(L)=0.7\text{ V}-0.5\text{ V}=0.2\text{ V} \qquad \text{expression (3)}$$

Namely, if the low-side internal power supply voltage VSL does not fluctuate, when the first transmission wiring RWBS is at a low level, a voltage margin of 0.2 V is present, as represented by expression (3). However, if the voltage of the low-side internal power supply voltage VSL fluctuates and exceeds 0.5 V, VRWBS(L) is accordingly increased, thereby decreasing the voltage margin. In (a) the example 2 of FIG. 11, since the low-side internal power supply voltage VSL is increased (floated) from 0.5 V to 0.6 V, if no measures were taken, the voltage margin would be decreased by 0.1 V. However, in the present example, since the interwiring capacitance is purposefully arranged between the low-side internal power supply voltage VSL and the second transmission wiring VREF, when the low-side internal power supply voltage VSL floats, the potential of the second transmission wiring VREF also floats, thereby reducing a decrease of the voltage margin. When this low-side internal power supply voltage VSL is increased from 0.5 V to 0.6 V, the reference voltage VREF transmitted through the second transmission wiring is increased from 0.7 V to 0.75 V (see time around 152 ns in (a) the example 2 of FIG. 11). The voltage margin in this state can be represented by expression (4).

$$\text{VREF}-\text{VRWBS}(L)=0.75\ V-0.6\ V=0.15\ V \quad \text{expression (4)}$$

Namely, if no measures are taken, when the low-side internal power supply voltage VSL is increased, the voltage margin is accordingly decreased by the increase. However, in the present example, because of the interwiring capacitance, when the low-side internal power supply voltage VSL is increased, the voltage of the reference voltage VREF is also increased, thereby reducing a decrease of the voltage margin.

In contrast, in (b) the comparative example of FIG. 11, since no interwiring capacitance is arranged between the low-side internal power supply voltage VSL and the second transmission wiring VREF, if the potential of the low-side internal power supply voltage VSL is increased, the amount of increase in voltage is directly reflected as a decrease of the voltage margin. Namely, the voltage margin according to (b) the comparative example of FIG. 11 can be represented by expression (5).

$$\text{VREF}-\text{VRWBS}(L)=0.7\ V-0.6\ V=0.1\ V \quad \text{expression (5)}$$

Based on (b) the comparative example of FIG. 11, as represented by expression (5), when the low-side internal power supply voltage VSL is increased by 0.1 V, the voltage margin is decreased to 0.1 V. However, based on (a) the example 2 of FIG. 11, as represented by expression (4), a voltage margin of 0.15 V is ensured. Namely, assuming that the original voltage margin 0.2 V represented by expression (3) is used as a reference, since the voltage margin of the example 2 calculated by expression (4) is 0.15 V and the voltage margin of the comparative example calculated by expression (5) is 0.1 V, the voltage margin (signal amount) is improved by 25%. In addition, because of the improvement of the voltage margin, access time is also improved by 0.14 ns.

Figure 12:
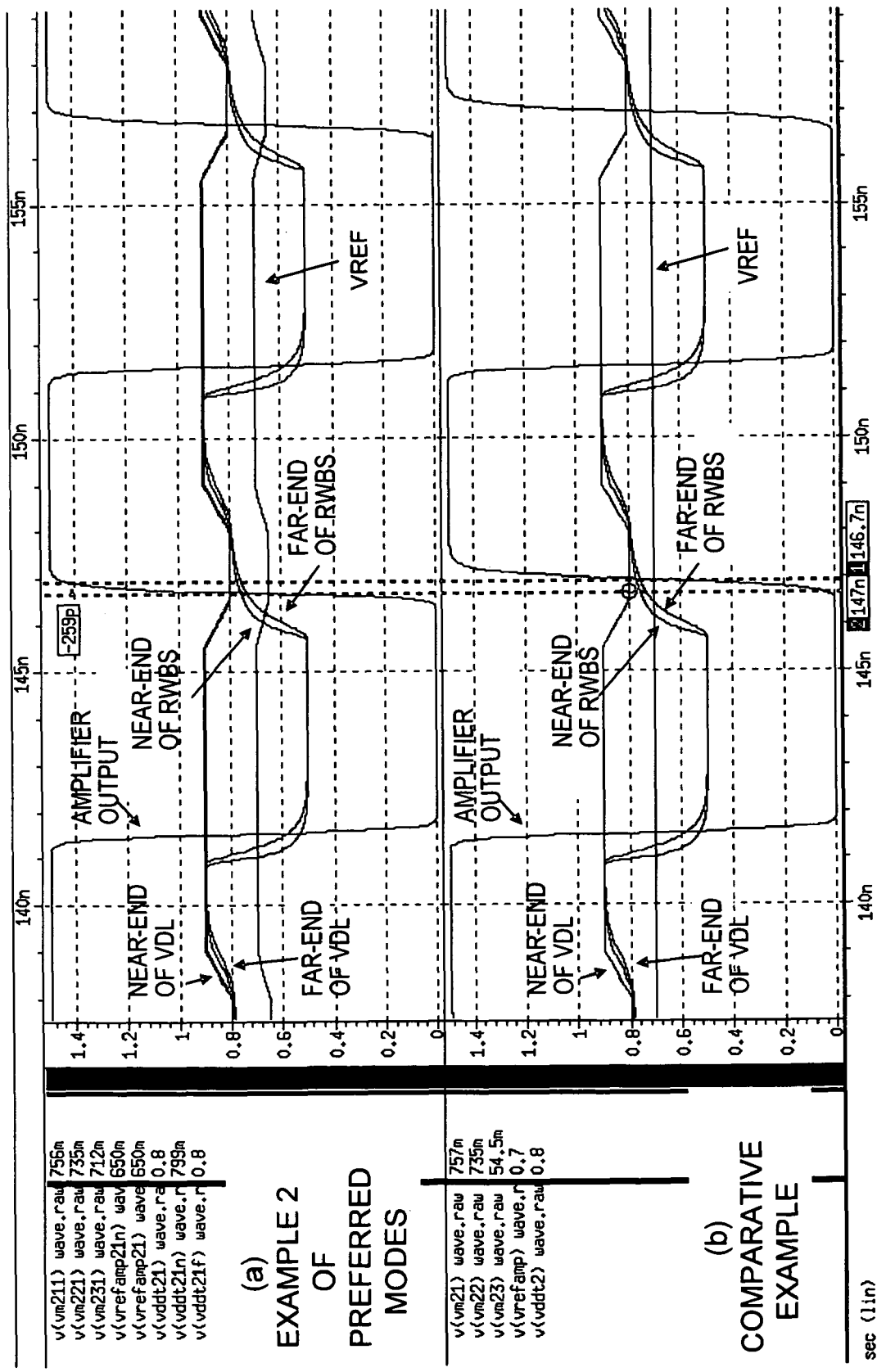
FIG. 12 illustrates simulation waveforms of transmission wirings according to example 2 of preferred modes and a comparative example, respectively, when an internal power supply VDL fluctuates.

FIG. 12 illustrates simulation waveforms of signals transmitted through transmission wirings according to (a) example 2 of preferred modes and (b) a comparative example, respectively, when the internal power supply VDL fluctuates. In (a) the example 2 of FIG. 12, the second transmission wiring VREF and the high-side internal power supply wiring VDL are arranged close to each other, and the interwiring capacitance between the second transmission wiring VREF and the internal power supply wiring VDL is set to be large. On the other hand, in (b) the comparative example of FIG. 12, no interwiring capacitance is provided between the second transmission wiring VREF and the internal power supply wiring VDL.

In FIG. 12, the vertical axis represents voltage (V) and the horizontal axis represents time (ns). The power supplies are set as follows: VDD=1.5 V, VSS=0 V, VSL=0.5 V, VDL=0.9 V, and VREF=0.7 V. However, the power supply VDL is not completely fixed at 0.9 V. The power supply VDL sank down to 0.8 V in conjunction with the circuit operation (see time around 147 ns in FIG. 12, for example). In (a) the example 2 of FIG. 12, because of the interwiring capacitance between VDL and VREF, the second transmission wiring VREF fluctuates between 0.65 V and 0.7 V in conjunction with the fluctuation of VDL.

Assuming that the high level voltage transmitted through the first transmission wiring RWBS is VRWBS(H), originally, the signal amount (the voltage margin between the high level voltage transmitted through the first transmission wiring and the reference voltage transmitted through the second transmission wiring) can be represented by expression (6).

$$\text{VRWBS}(H)-\text{VREF}=0.9\ V-0.7\ V=0.2\ V \quad \text{expression (6)}$$

Namely, if the high-side internal power supply voltage VDL does not fluctuate, when the first transmission wiring RWBS is at a high level, a voltage margin of 0.2 V is present, as represented by expression (6). However, if the voltage of the high-side internal power supply voltage VDL fluctuates and falls below 0.9 V, VRWBS(H) is accordingly decreased, thereby decreasing the voltage margin. In (a) the example 2 of FIG. 12, since the high-side internal power supply voltage VDL is decreased (sinks) from 0.9 V to 0.8 V, if no measures were taken, the voltage margin would be decreased by 0.1 V. However, in the present example, since the interwiring capacitance is purposefully arranged between the high-side internal power supply voltage VDL and the second transmission wiring VREF, when the high-side internal power supply voltage VDL sinks, the potential of the second transmission wiring VREF also sinks, thereby reducing a decrease of the voltage margin. When this high-side internal power supply voltage VDL is decreased from 0.9 V to 0.8 V, the reference voltage VREF transmitted through the second transmission wiring is decreased from 0.7 V to 0.65 V (see time around 147 ns in (a) the example 2 of FIG. 12). The voltage margin in this state can be represented by expression (7).

$$\text{VRWBS}(H)-\text{VREF}=0.8\ V-0.65\ V=0.15\ V \quad \text{expression (7)}$$

Namely, if no measures are taken, when the high-side internal power supply voltage VDL is decreased, the voltage margin is accordingly decreased by the decrease. However, in the present example, because of the interwiring capacitance, when the high-side internal power supply voltage VDL is decreased, the voltage of the reference voltage VREF is also decreased, thereby reducing a decrease of the voltage margin.

In contrast, in (b) the comparative example of FIG. 12, since no interwiring capacitance is arranged between the high-side internal power supply voltage VDL and the second transmission wiring VREF, if the potential of the high-side internal power supply voltage VDL is decreased, the amount of decrease in voltage is directly reflected as a decrease of the voltage margin. Namely, the voltage margin according to (b) the comparative example of FIG. 12 can be represented by expression (8).

$$\text{VRWBS}(H)-\text{VREF}=0.8\ V-0.7\ V=0.1\ V \quad \text{expression (8)}$$

Based on (b) the comparative example of FIG. 12, as represented by expression (8), when the high-side internal power supply voltage VDL is decreased by 0.1 V, the voltage margin is decreased to 0.1 V. However, based on (a) the example 2 of FIG. 12, as represented by expression (7), a voltage margin of 0.15 V is ensured. Namely, assuming that the original voltage margin 0.2 V represented by expression (6) is used as a reference, since the voltage margin of the example calculated by expression (7) is 0.15 V and the voltage margin of the comparative example calculated by expression (8) is 0.1 V, the voltage margin (signal amount) is improved by 25%. In addition, because of the improvement of the voltage margin, access time is also improved by 0.26 ns.

Example 3

In example 3, a wiring connected to a fixed potential such as at VSS or VDD is arranged between one of the internal power supply wirings VDL and VSL sandwiching the second transmission wiring VREF and a drive wiring which has a potential that fluctuates and which is arranged outside the internal power supply wirings VDL and VSL. This fixed potential wiring of example 3 prevents fluctuations of the voltage level of a signal transmitted through the drive wiring from affecting the second transmission wiring VREF and the internal power supply wirings VDL and VSL. Since the second and fourth drivers 41 and 42 driving the second transmission wiring VREF have a relatively high output impedance, the drivers 41 and 42 are easily affected by noises. Even if the second transmission wiring VREF is sandwiched by the internal power supply wirings VDL and VSL, if the potential of a signal wiring arranged outside the internal power supply wiring VDL/VSL fluctuates, the fluctuation affects the internal power supply wiring VDL/VSL. As a result, the potential of the internal power supply wiring VDL/VSL fluctuates, and the fluctuation of the internal power supply wiring VDL/VSL affects the potential of the second transmission wiring VREF. Fluctuations of the potential of the second transmission wiring VREF in conjunction with fluctuations of the internal power supply VDL/VSL in the first driver (336 and 337 of FIG. 3) and the third driver (366 and 367 of FIG. 3) outputting data is preferable. However, if the second transmission wiring VREF is fluctuated by fluctuations of the internal power supply wiring VDL/VSL that are not based on potential fluctuations of the power supplies of the first and third drivers outputting data, malfunctions may be caused. In example 3, since a wiring connected to a fixed potential is arranged between one of the internal power supply wirings VDL and VSL sandwiching the second transmission wiring VREF and a signal wiring (drive wiring) that may cause noises, the wiring connected to the fixed potential prevents that the signal wiring causes adverse effects by interwiring parasitic capacitance, interwiring mutual inductance, and the like.

Figure 10A:
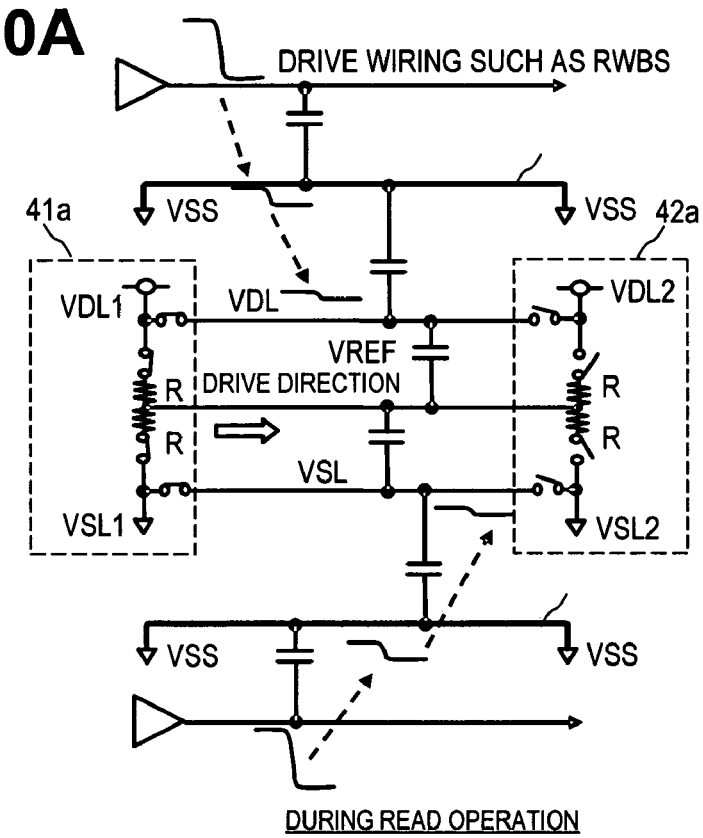
FIGS. 10A and 10B illustrate states of internal power supply wirings and a reference voltage transmission wiring during read and write operations, respectively, according to example 3.
Figure 10B:
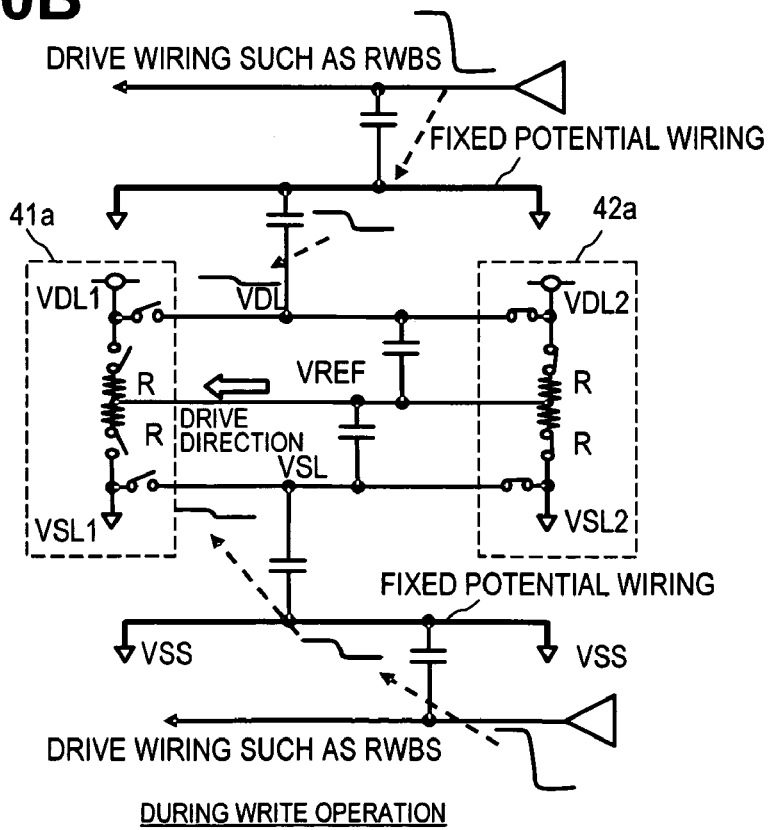

FIG. 10A illustrates the impact of noises on the internal power supply wirings VDL and VSL and the reference voltage transmission wiring (second transmission wiring) VREF during a read operation (when data is outputted from the internal circuit side to the external terminal side) according to example 3. FIG. 10B illustrates the impact of noises on the internal power supply wirings and the reference voltage transmission wiring during a write operation (when data is inputted from the external terminal side to the internal circuit side) according to example 3.

In FIG. 10A, the internal power supply wirings VDL and VSL sandwich the second transmission wiring VREF, and outside of each of the wirings VDL and VSL, a fixed potential wiring is arranged (in FIG. 10A, wirings having a potential fixed at the power supply VSS are used). The power supply VSS is used only as an example of the fixed potential of the wiring. Other than the power supply VSS, an arbitrary power supply wiring or test mode signal wiring not used during a normal operation may be used. A signal wiring having a potential that fluctuates, such as the first transmission wiring RWBS, is arranged outside of each of these fixed potential wirings. Because of the interwiring capacitance between the signal wiring and the fixed potential wiring VSS, when the potential of the signal wiring (drive wiring such as RWBS) fluctuates, the fixed potential wiring (VSS in FIG. 10A) is somewhat affected and the potential thereof is fluctuated. Between the fixed potential wirings VSS, the internal power supply wirings VDL and VSL are arranged. Because of the interwiring capacitance between the fixed potential wiring VSS and the internal power supply wiring VDL/VSL, the potential fluctuation of the fixed potential wiring VSS is attenuated. However, the potential fluctuation still affects the potential of the internal power supply wiring VDL/VSL. However, since the second transmission wiring VREF is arranged between the internal power supply wirings VDL and VSL, even if the potential of the signal wiring such as the first transmission wiring RWBS fluctuates, the potential of the second transmission wiring VREF arranged at the innermost position has little impact. As illustrated in FIG. 10A, when read data is outputted from the internal circuit side to the external terminal side during a read operation, the internal-circuit-side reference voltage driver 41a is turned on and connected to the internal power supply wirings, and the external-terminal-side reference voltage driver 42a is brought in an output high impedance state. In addition, the power supply terminals VDL2 and VSL2 of the external-terminal-side reference voltage driver 42a are separated from the internal power supply wirings VDL and VSL, as in example 2. In this way, the same meritorious effects as described in example 2 can be obtained.

In contrast, as illustrated in FIG. 10B, when write data is inputted from the external terminal side to the internal circuit side during a write operation, the external-terminal-side reference voltage driver 42a is turned on and connected to the internal power supply wirings VDL and VSL, and the internal-circuit-side reference voltage driver 41a is brought in an output high impedance state. In addition, the power supply terminals VDL1 and VSL1 of the internal-circuit-side reference voltage driver 41a are separated from the internal power supply wirings VDL and VSL, as in example 2. In this way, the same meritorious effects as described in example 2 can be obtained.

Example 4

Figure 13:
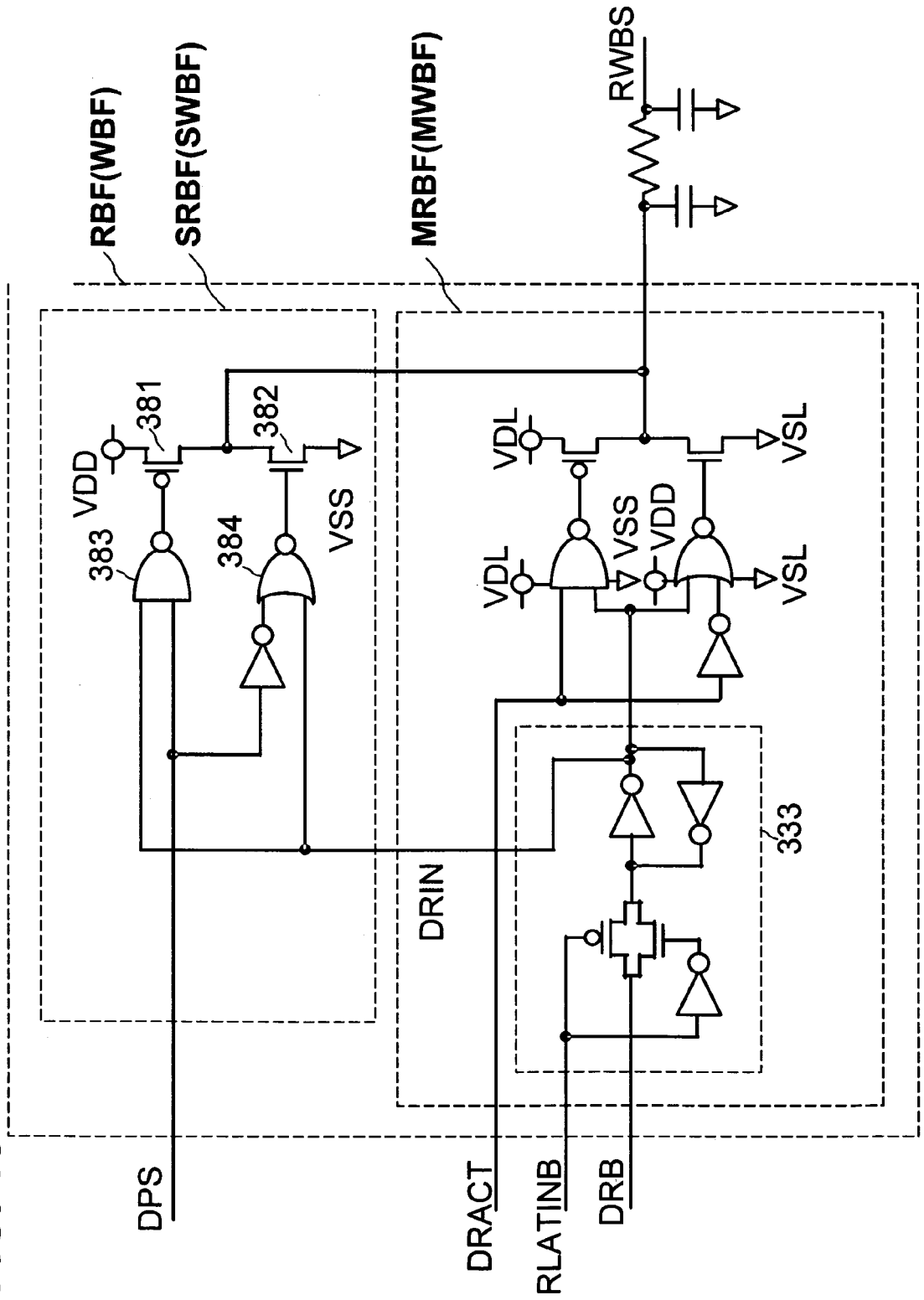
FIG. 13 is a circuit block diagram of a data buffer according to example 4.

FIG. 13 is a circuit block diagram of a data buffer according to example 4. The data buffer of FIG. 13 can be used as the read data buffer RBF and/or the write data buffer WBF of examples 1 to 3 (see FIGS. 2 and 3). While the data buffer of FIG. 13 can be used as both the read data buffer RBF and the write data buffer WBF, the data buffer is used as the read data buffer RBF in example 4.

In FIG. 13, the configuration and operation of a main read buffer MRBF of example 4 are the same as those of the read data buffer RBF of example 1. In addition to this main read buffer MRBF, the data buffer of FIG. 13 includes a sub-read buffer SRBF. All the circuits constituting the sub-read buffer SRBF are supplied with the power supplies VDD and VSS. Namely, the internal power supplies VDL and VSL used as the power supplies of the small-amplitude signal are not supplied to the sub-read buffer SRBF. This sub-read buffer SRBF functions as an auxiliary driver of the main read buffer MRBF.

The sub-read buffer SRBF includes: a NAND circuit 383 having one input terminal connected to a control signal DPS and the other input terminal connected to a data signal DRIN held by the latch circuit 333; a NOR circuit 384 having one input terminal connected to an inverted signal of the control signal DPS and the other input terminal connected to the data signal DRIN; a P-channel MOS transistor 381 having a gate connected to the output signal from the NAND circuit 383, a source connected to the power supply VDD, and a drain connected to the first transmission wiring RWBS; and an N-channel MOS transistor 382 having a gate connected to the output signal from the NOR circuit 384, a source connected to the power supply VSS, and a drain connected to the first transmission wiring RWBS.

Figure 14:
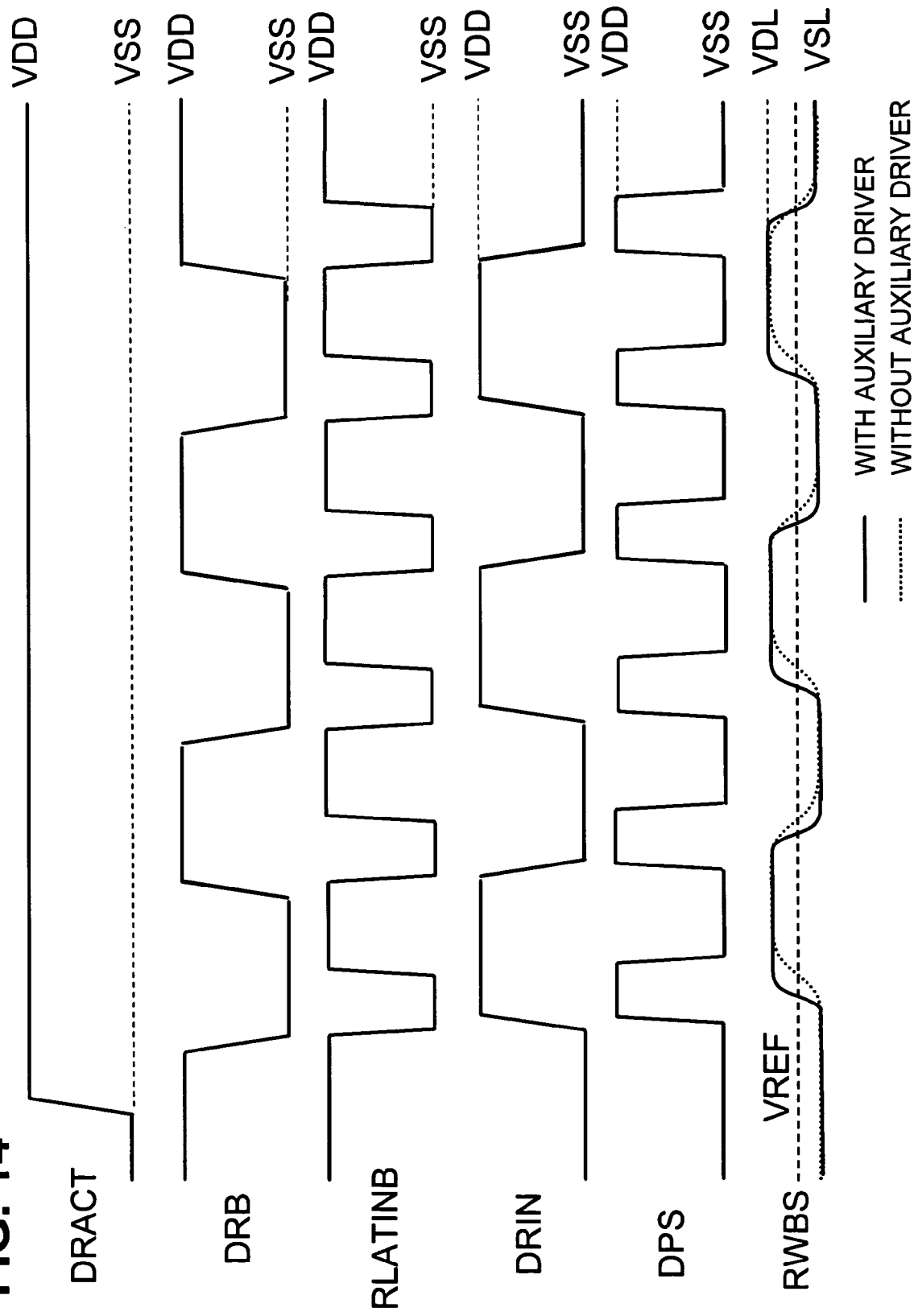
FIG. 14 is a waveform diagram illustrating operations of the data buffer according to example 4.

FIG. 14 is a waveform diagram illustrating operations of the read data buffer RBF according to example 4. The control signal DRACT is a signal that activates the output of the read data buffer RBF. When the control signal DRACT is at a low level, a driver of the main read buffer MRBF is in an output high impedance state, and when the control signal DRACT is at a high level, the driver of the main read buffer MRBF establishes continuity. The inverted data signal DRB is an input data signal to the read data buffer RBF. The latch circuit 333 receives the latch signal RLATINB, captures the inverted data signal DRB in synchronization with a falling edge of the latch signal RLATINB, and outputs the latched data signal DRIN. When the latch signal RLATINB is at a high level, the latch circuit 333 holds data, irrespective of the logic level of the inverted data signal DRB. The sub-read buffer SRBF receives the control signal DPS. When the control signal DPS is at a high level, based on the data signal DRIN outputted from the latch circuit 333, the P-channel MOS transistor 381 or the N-channel MOS transistor 382 establishes continuity. Only when the control signal DRACT is at a high level, the latch signal RLATINB is at a low level, and data of the latch circuit 333 is updated, the control signal DPS is outputted as a one-shot pulse.

RWBS represents the voltage level of the first transmission wiring RWBS. The dashed line represents the voltage level of the first transmission wiring RWBS when the sub-read buffer SRBF as an auxiliary driver is not arranged, and the solid line represents a voltage level of the first transmission wirings RWBS when the sub-read buffer SRBF as an auxiliary driver is arranged. Since the auxiliary driver is caused to establish continuity in synchronization with rising and falling edges of the first transmission wiring RWBS, rising and falling edges of the first transmission wiring RWBS can be made steeper. Further, since the auxiliary driver does not establish continuity when the logic level of the first transmission wiring RWBS does not change, the signal transmitted through the first transmission wiring RWBS does not overly swing unnecessarily. As a result, the signal can maintain a small amplitude level.

Namely, since the sub-read buffer SRBF is arranged, even if the electric potential difference between the internal power supply voltages VDL and VSL is small, the driving capability of the main read buffer MRBF can be compensated. Thus, charge/discharge time of the first transmission wirings RWBS can be shortened, thereby shortening access time.

Figure 15:
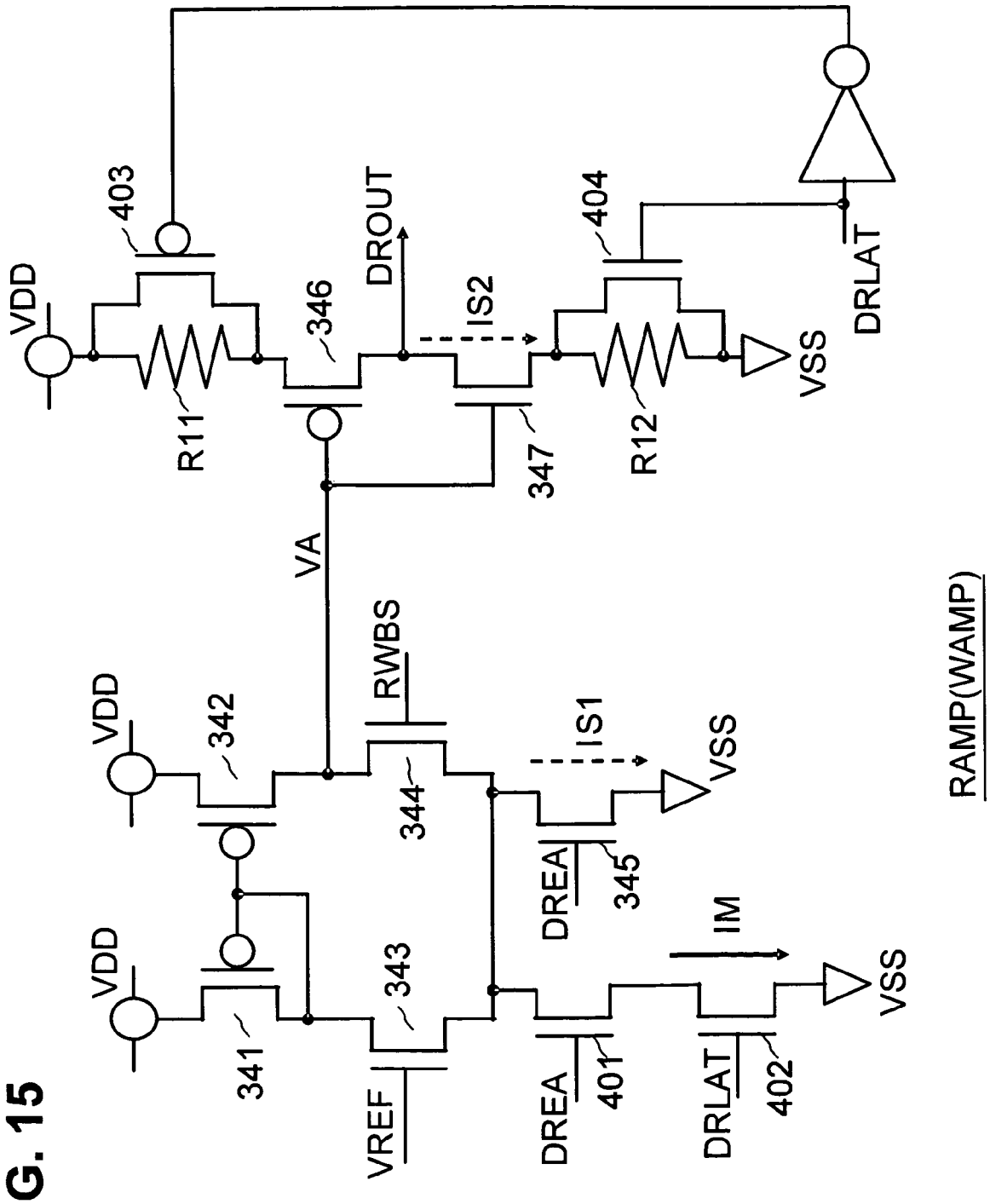
FIG. 15 is a circuit block diagram of a data receiver according to example 4.

FIG. 15 is a circuit block diagram of a data receiver according to example 4. The data receiver of FIG. 15 can be used as the first receiver RAMP and/or the second receiver WAMP according to examples 1 to 3 (see FIGS. 2, 3, and 5). While the data receiver of FIG. 15 can be used both as the first receiver RAMP and the second receiver WAMP, in the following example, the data receiver is used as the first receiver RAMP.

The receiver RAMP of FIG. 15 includes: a differential circuit including N-channel MOS transistors 345, 401, and 402 forming a current source, N-channel MOS transistors 343 and 344 forming a differential pair, and P-channel MOS transistors 341 and 342 forming a load circuit; and an output circuit including P-channel MOS transistors 346 and 403 and N-channel MOS transistors 347 and 404.

The current source circuit (345, 401, 402) of the differential circuit of FIG. 15 includes two channel current sources: one current source including the N-channel MOS transistor 345 constantly allowing a current IS1 to flow when receiving data through the first transmission wiring (when outputting read data) and the other current source including the N-channel MOS transistors 401 and 402 allowing a current IM to flow at a certain timing. The N-channel MOS transistor 402 has a gate connected to a control signal DRLAT, and each of the N-channel MOS transistors 345 and 401 has a gate connected to a control signal DREA.

Further, in the output circuit, the P-channel MOS transistor 403 having a gate connected to an inverted signal of the control signal DRLAT and a resistor R11 are connected in parallel between a source of the P-channel MOS transistor 346 used as a driver and the power supply VDD. Further, in the output circuit, the N-channel MOS transistor 404 having a gate connected to the control signal DRLAT and a resistor R12 are connected in parallel between a source of the N-channel MOS transistor 347 used as a driver and the power supply VSS.

Figure 16:
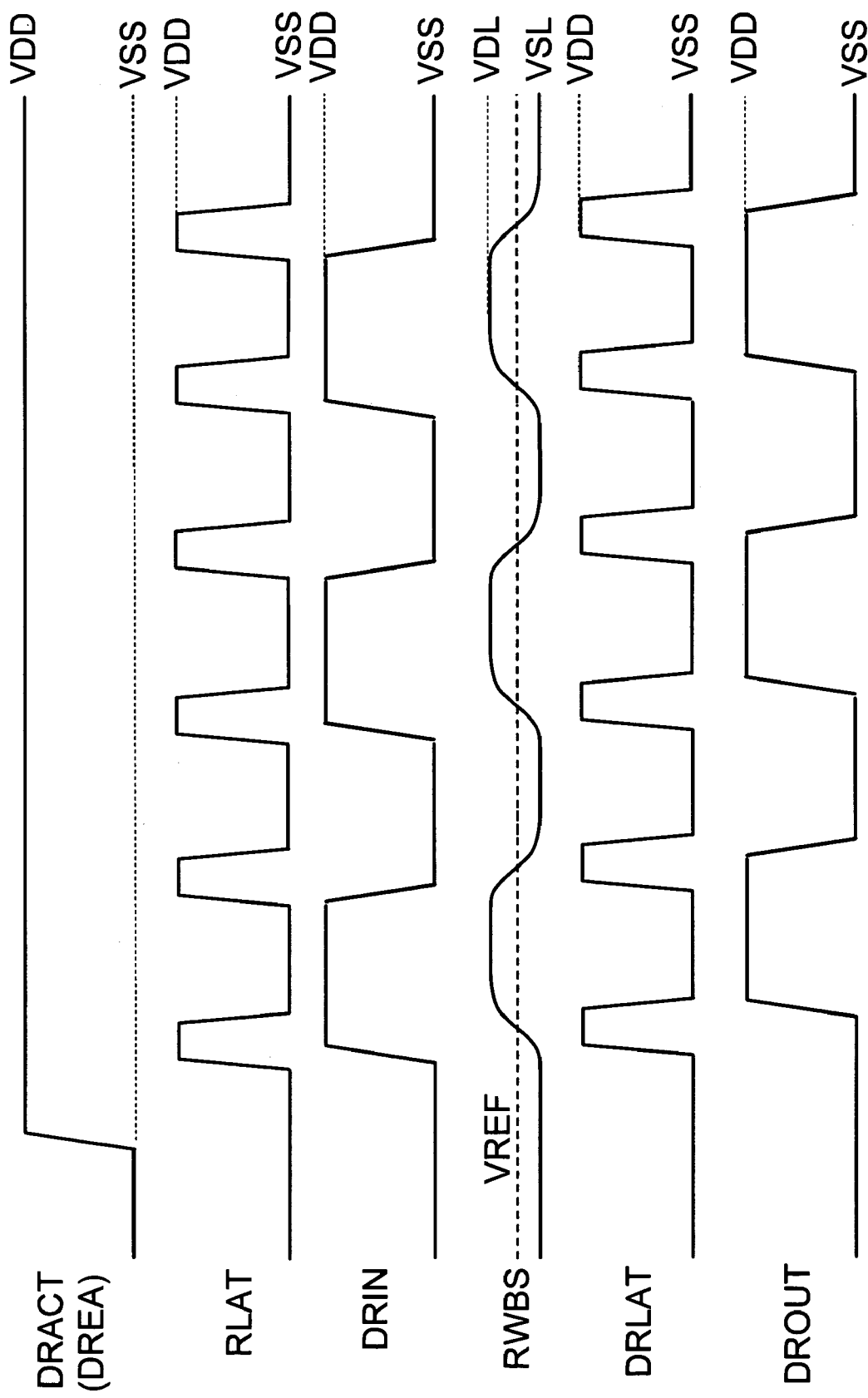
FIG. 16 is a waveform diagram illustrating operations of the data receiver according to example 4.

FIG. 16 is a waveform diagram illustrating operations of the data receiver of FIG. 15. The control signal DRACT is a signal controlling the driver side, and the data signal DRIN is a signal outputted from the driver side. The signal RLAT is an inverted signal of RLATINB of FIG. 13, and the data signal DRIN is updated in synchronization with a rising edge of RLAT. When the control signal DRACT rises to a high level, a small-amplitude signal based on the data signal DRIN is outputted to the first transmission wiring. The data receiver activates the control signal DREA in synchronization with a rising edge of the control signal DRACT and starts supplying a current to the differential circuit.

The control signal DRLAT has a phase lagging that of the control signal RLAT. The data receiver brings the control signal DRLAT to a high level in one shot when data transmitted from the driver side changes. When the control signal DRLAT is brought to a high level, the N-channel MOS transistor 402 establishes continuity, and the current flowing through the differential circuit (343, 344) is increased from IS1 to IS1+IM. When the current flowing through the differential circuit is increased, the differential circuit operates at higher speed and outputs comparison results to a node VA.

Further, when the control signal DRLAT is brought to a high level, the P-channel MOS transistor 403 and the N-channel MOS transistor 404 in the output circuit establish continuity. The output circuit converts the voltage level at the node VA into a CMOS-level output signal and outputs the converted signal from DROUT.

Next, when the control signal DRLAT falls, the current flowing through the differential circuit is decreased to IS1. However, since supply of the decreased current is maintained, the differential circuit maintains the output level (comparison results) to the node VA. Further, when the control signal DRLAT falls, the P-channel MOS transistor 403 and the N-channel MOS transistor 404 in the output circuit break continuity. When the P-channel MOS transistor 403 and the N-channel MOS transistor 404 in the output circuit break continuity, the load driving capability of the output circuit is decreased. However, since the resistors R11 and R12 are connected in parallel to the P-channel MOS transistor 403 and the N-channel MOS transistor 404, respectively, the output voltage level of DROUT is maintained.

By using the above data receiver, since the current flowing through the differential circuit can be increased when data transmitted though the first transmission wiring RWBS changes, the differential circuit can be operated at high speed. In addition, since the driving capability of the output circuit can be increased, a load can be driven at high speed.

On the other hand, when data transmitted through the first transmission wiring does not change, the current flowing through the differential circuit is decreased and controlled. Further, since the signal outputted from the differential circuit to the node VA is not completely a CMOS-level signal, when the differential circuit operates, a shoot-through current flows through the output circuit. However, since the P-channel MOS transistor 403 and the N-channel MOS transistor 404 connected in parallel with the resistors R11 and R12, respectively, are controlled to break continuity, the shoot-through current flowing through the output circuit can be reduced while maintaining the output voltage at DROUT.

The control signal DRLAT can be generated by delaying the latch signal of the latch circuit on the driver side. The data receiver described with reference to FIGS. 15 and 16 can be used as any one of the receivers according to examples 1 to 3.

Example 5

Figure 18:
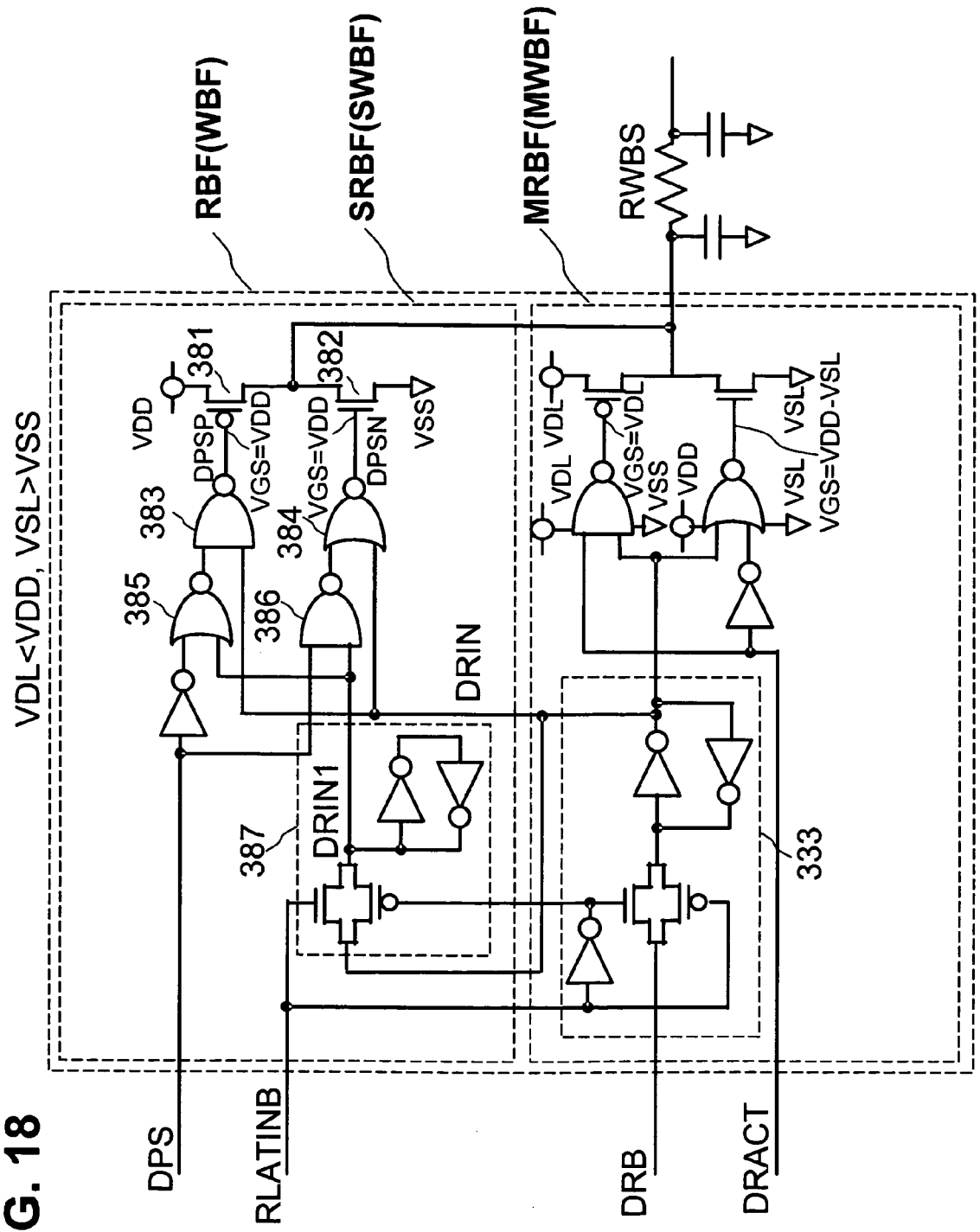
FIG. 18 is a circuit block diagram of a data buffer according to example 5.

FIG. 18 is a circuit block diagram of a data buffer according to example 5. Unlike the data buffer according to example 4 of FIG. 13, based on the data buffer of FIG. 18 according to example 5, even when data of the latch circuit 333 is updated, if the data is updated to the same data and no change is made in the logic level of the small-amplitude signal outputted from the first transmission wiring RWBS, the sub-read buffer SRBF (sub-write buffer SWBF) does not establish continuity, thereby reducing the power consumption. As with the data buffer according to example 4, while the data buffer according to example 5 can be used as both the read data buffer RBF and the write data buffer WBF, the data buffer is used as the read data buffer RBF in example 5.

The read data buffer RBF according to example 5 of FIG. 18, as in example 4, includes the main read buffer MRBF and the sub-read buffer SRBF, and the configuration and operation of the main read buffer MRBF are the same as those of the main read buffer MRBF according to example 4. The sub-read buffer SRBF according to example 5 includes: a latch circuit 387 latching the data signal DRIN at a falling edge of RLATINB; and combinational circuits (NAND circuit 386 and NOR circuit 385) establishing continuity of a drive transistor 381 or 382 in the sub-read buffer SRBF when data from the latch circuits 387 and 333 is changed.

Figure 19:
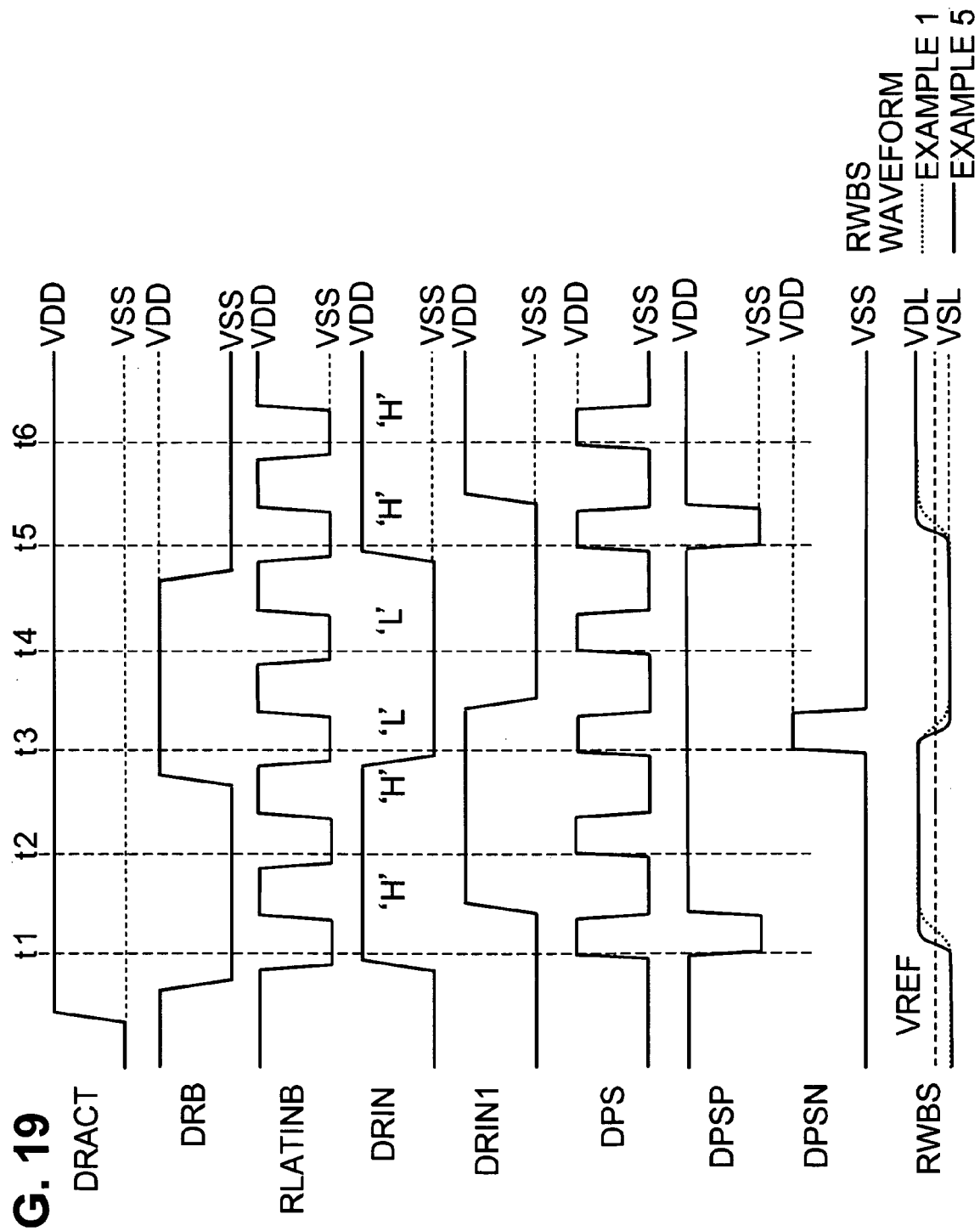
FIG. 19 is a waveform diagram illustrating operations of the data buffer according to example 5.

FIG. 19 is a waveform diagram illustrating operations of the read data buffer RBF of FIG. 18. Since the control signal DRACT, the inverted data signal DRB, the latch signal RLATINB of the latch circuit 333, the data signal DRIN latched by the latch circuit 333 are the same signals as those according to example 4, repetitive description thereof will be omitted. DRIN1 is an output signal from the latch circuit 387 arranged in the sub-read buffer SRBF. The control signal DPS is the same as that according to example 4. A control signal DPSP is a gate signal inputted to the P-channel MOS transistor 381, which is a driver transistor of the sub-read buffer SRBF. When the control signal DPSP is at a low level, the P-channel MOS transistor 381 establishes continuity, and when the control signal DPSP is at a high level, the P-channel MOS transistor 381 breaks continuity. Further, a control signal DPSN is a gate signal inputted to the N-channel MOS transistor 382, which is another driver transistor of the sub-read buffer SRBF. When the control signal DPSN is at a high level, the N-channel MOS transistor 382 establishes continuity, and when the control signal DPSN is at a low level, the N-channel MOS transistor 382 breaks continuity. RWBS is the voltage level of the first transmission wiring RWBS.

In FIG. 19, when focusing on the inverted data signal DRB and the latch signal RLATINB, which are input data signals to the read data buffer RBF, and the data signal DRIN latched by the latch circuit 333, the logic level of the latched data signal DRIN is inverted at only some of the falling edges of the latch signal RLATINB. For example, the data signal DRIN rises from a low level to a high level at time t1 and t5, and the data signal DRIN falls from a high level to a low level at time t3. However, at time t2, t4, and t6, since data of the latch circuit 333 is updated to the same data, the logic level of the data signal DRIN is maintained at the same logic level. Further, the output data signal DRIN1 from the latch circuit 387 arranged in the sub-read buffer SRBF is a data signal lagging the data signal DRIN by half cycle of the latch signal RLATINB.

The sub-read buffer SRBF controls signals based on the data signals DRIN and DRIN1 and the control signal DPS. More specifically, only when the data signal DRIN rises from a low level to a high level (only time t1 and t5), the control signal DPSP is brought to a low level in one shot and the P-channel MOS transistor 381 is caused to establish continuity. Only when the data signal DRIN falls from a high level to a low level (only time t3), the control signal DPSN is brought to a high level in one shot and the N-channel MOS transistor 382 is caused to establish continuity. At other times, even when data of the latch circuit 333 is updated, if the data is updated to the same logic level and there is no need to change the logic level of the small-amplitude signal outputted to the first transmission wiring RWBS, the P-channel MOS transistor 381 and the N-channel MOS transistor 382 are not caused to establish continuity. In addition to the meritorious effects obtained by example 4, this configuration can prevent the original voltage level (high level VDL or low level VSL) of the small-amplitude signal transmitted through the first transmission wiring RWBS from unnecessarily reaching an excessively high level (over VDL) or low level (below VSL).

Example 6

Figure 17:
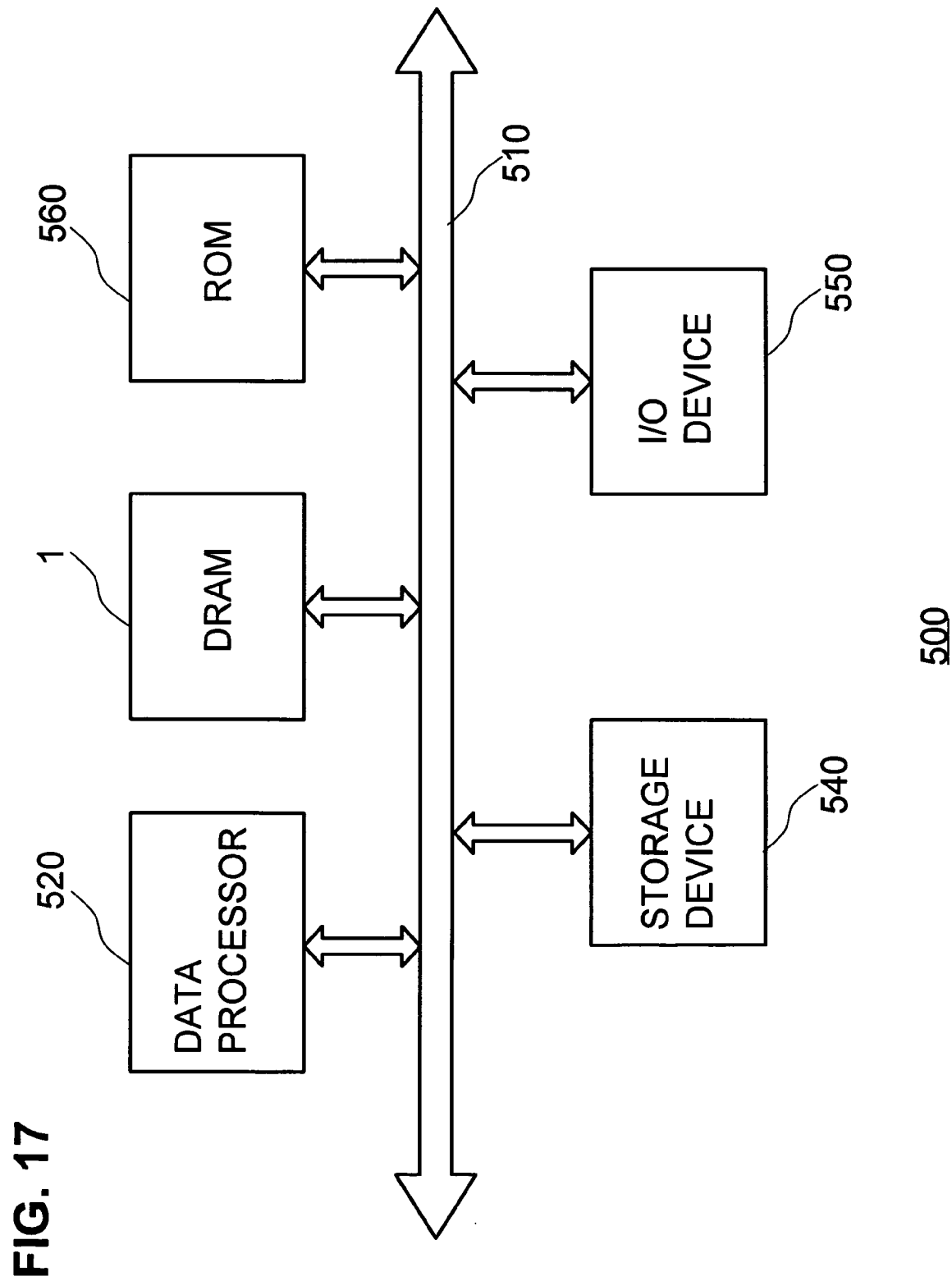
FIG. 17 is a block diagram of a data processing system according to example 6.

FIG. 17 is a block diagram of a data processing system 500 using the semiconductor device 1. In the data processing system 500 of FIG. 17, a data processor 520 and the semiconductor device (DRAM) 1 are mutually connected via a system bus 510. For example, the data processor 520 may be a microprocessor (MPU) or a digital signal processor (DSP). However, the data processor 520 is not limited to these examples. In FIG. 17, for ease of description, the data processor 520 and the DRAM 1 are connected via the system bus 510. However, the data processor 520 and the DRAM 1 may be connected to each other via a local bus, instead of the system bus 510.

In addition, for ease of description, FIG. 17 illustrates only a pair of system buses 510. However, a plurality of system buses 510 may be arranged in serial or parallel via connectors, as needed. In addition, while a storage device 540, an I/O device 550, and a ROM 560 are connected to the system bus 510 in the data processing system 500 of FIG. 17, these devices are not essential components.

Examples of the storage device 540 include a hard disk drive, an optical disk drive, and a flash memory. Examples of the I/O device 550 include: a display device such as a liquid crystal display; and an input device such as a keyboard and a mouse.

The I/O device 550 may be either an input device or an output device.

In addition, while FIG. 17 illustrates only a single component for each component type for ease of description, the data processing system is not limited to such example. A plurality of components may be arranged for one or more component types.

In example 6, a controller (data processor 520, for example) controlling the DRAM 1 uses the system clocks CK and CKB and other control signals to issue various types of commands relating to read and write access to data in the DRAM 1. Upon receiving a read command from the controller, the semiconductor device 1 reads stored information held therein and outputs the data to the system bus 510 via the first transmission wirings RWBS (FIG. 1). When the semiconductor device 1 receives a write command from the controller, the semiconductor device 1 writes data inputted through the system bus 510 in the corresponding memory cell array 10 via the first transmission wirings RWBS. The commands issued by the controller are known commands (system commands) that control semiconductor devices and that are defined by an industry organization (Joint Electron Device Engineering Council (JEDEC) Solid State Technology Association).

In example 6, not only the DRAM 1, but also the storage device 540, the I/O device 550, and the ROM 560 may be a semiconductor device using the first and second transmission wirings RWBS and VREF described in examples 1 to 5 for internal data transmission. In response to a request from the data processor, data input/output can be executed at high speed with low power consumption inside each chip.

The above examples have been described based on an example where data is transmitted bi-directionally. However, data transmission does not need to be executed bi-directionally. According to the present invention, even when data is transmitted unidirectionally, data can be transmitted with low power consumption at high speed. Further, the above examples 1 to 5 have been described based on an example where data is transmitted between the internal circuit side and the external terminal side. However, the present invention is not limited to data transmission between the internal circuit side and the external terminal side. The present invention is, of course, applicable to data transmission between internal circuits.

Further, while the above examples have been described based on transmission of a memory data signal, the present invention is not limited to such examples. For example, the present invention is applicable to transmission of data processor data. Further, specific circuit forms of the drivers and the receivers as well as other circuits generating control signals are not limited to those described in the examples. For example, the control units (circuits) generating a small-amplitude signal are not limited to the examples.

The semiconductor device including the transmission wirings according to the present invention can be applied to general semiconductor devices, such as a central processing unit (CPU), a micro control unit (MCU), a digital signal processor (DSP), an application specific integrated circuit (ASIC), and an application specific standard product (ASSP). Examples of a product form of such semiconductor device according to the present invention include system on chip (SOC), multi-chip package (MCP), and package on package (POP). The present invention can be applied to semiconductor devices having these arbitrary product forms and package forms.

In addition, the transistors used in the present invention are not limited to metal oxide semiconductors (MOSs), as long as the transistors are field-effect transistors (FETs). Various types of FETs are applicable, such as metal-insulator semiconductors (MISs) and thin film transistors (TFTs). In addition, some of the transistors may be bipolar-type transistors. Transistors other than FETs may be used.

A P-channel MOS transistor (P-type-channel MOS transistor) is a typical example of a first conductivity type transistor, and an N-channel MOS transistor (N-type-channel MOS transistor) is a typical example of a second conductivity type transistor.

As described with reference to the drawings, the present invention is applicable to various modes. Some of the preferable modes will be listed below:

(Mode 1)
A semiconductor device including:
a first logic circuit that is supplied with a power supply voltage having a third potential and a power supply voltage having a fourth potential lower than the third potential and that operates based on the voltages; and
a driver circuit that converts an output signal from the first logic circuit into a small-amplitude signal exhibiting a first potential lower than the third potential and higher than the fourth potential as a high level and a second potential lower than the first potential and higher than the fourth potential as a low level and that outputs the small-amplitude signal, the electric potential difference between the first potential and the second potential being smaller than the electric potential difference between the third potential and the fourth potential,
wherein the driver circuit includes:
a main driver that has a power supply connected to the first potential and the second potential and that outputs the small-amplitude signal in response to the output signal; and
an auxiliary driver that has a power supply connected to the third potential and the fourth potential, and
wherein the auxiliary driver establishes continuity in response to the output signal when the logic level of the output signal changes, and the auxiliary driver is maintained in an output high impedance state when the logic level of the first signal does not change.

In the above mode 1, for example, as illustrated in FIGS. 13 and 18, while it is preferable that the first potential (VDL, for example) be lower than the third potential (VDD, for example), the first potential and the third potential may be the same potential. In addition, while it is preferable that the second potential (VSL, for example) be higher than the fourth potential (VSS, for example), the second potential and the fourth potential may be the same potential. However, while the small-amplitude signal has an amplitude corresponding to the electric potential difference between the first potential and the second potential (electric potential difference between VDL and VSL, for example), the electric potential difference is smaller than the electric potential difference between the third potential and the fourth potential (electric potential difference between VDD and VSS, for example).

(Mode 2)
A semiconductor device including:
a first logic circuit that is supplied with a power supply voltage having a third potential and a power supply voltage having a fourth potential lower than the third potential and that operates based on the voltages; and
a driver circuit that converts an output signal from the first logic circuit into a small-amplitude signal exhibiting a first potential lower than the third potential and higher than the fourth potential as a high level and a second potential lower than the first potential and higher than the fourth potential as a low level and that outputs the small-amplitude signal, the electric potential difference between the first potential and the second potential being smaller than the electric potential difference between the third potential and the fourth potential,
wherein the driver circuit includes:
a main driver that has a power supply connected to the first potential and the second potential and that outputs the small-amplitude signal in response to the output signal;
a detection circuit that detects change of the logic level of the output signal; and
an auxiliary driver that has a power supply connected to the third potential and the fourth potential, and wherein the auxiliary driver establishes continuity in response to the output signal when the detection circuit detects change of the logic level, and the auxiliary driver is maintained in an output high impedance state when the detection circuit does not detect change of the logic level. For example, the circuits 383 to 387 of FIG. 18 function as a detection circuit.

(Mode 3)

A semiconductor device including:

a first logic circuit;

a second logic circuit arranged away from the first logic circuit;

a transmission wiring that connects the first logic circuit and the second logic circuit;

a driver circuit that converts an output signal from the first logic circuit into a small-amplitude signal having an amplitude smaller than the electric potential difference between high- and low-level signals of the first logic circuit and that outputs the small-amplitude signal to a first transmission wiring; and a receiver circuit that converts the small-amplitude signal into a signal, so that the signal has an amplitude corresponding to the electric potential difference between the high and low levels of a signal used by the second logic circuit and that outputs the signal to the second logic circuit, wherein the driver circuit includes:

a main driver that is connected to a power supply having a potential identical to the high level of the small-amplitude signal and to a power supply having a potential identical to the low level of the small-amplitude signal, that converts the output signal into the small-amplitude signal, and that outputs the small-amplitude signal to the first transmission wiring; and an auxiliary driver, which is an output driver connected to the same power supply system as that connected to the first logic circuit connected to the first transmission wiring, wherein the auxiliary driver establishes continuity in response to the output signal when the logic level of the output signal changes, and the auxiliary driver is maintained in an output high impedance state when the logic level of the first signal does not change.

(Mode 4)

A semiconductor device including:

a first logic circuit;

a second logic circuit arranged away from the first logic circuit;

a transmission wiring that connects the first logic circuit and the second logic circuit;

a driver circuit that converts an output signal from the first logic circuit into a small-amplitude signal having an amplitude smaller than the electric potential difference between high- and low-level signals of the first logic circuit and that outputs the small-amplitude signal to a first transmission wiring; and a receiver circuit that converts the small-amplitude signal into a signal, so that the signal has an amplitude corresponding to the electric potential difference between the high and low levels of a signal used by the second logic circuit and that outputs the signal to the second logic circuit, wherein the driver circuit includes:

a main driver that is connected to a power supply having a potential identical to the high level of the small-amplitude signal and to a power supply having a potential identical to the low level of the small-amplitude signal, that converts the output signal into the small-amplitude signal, and that outputs the small-amplitude signal to the first transmission wiring;

a detection circuit that detects change of the logic level of the output signal; and an auxiliary driver, which is an output driver connected to the same power supply system as that connected to the first logic circuit connected to the first transmission wiring, wherein the auxiliary driver establishes continuity in response to the output signal when the detection circuit detects change of the logic level, and the auxiliary driver is maintained in an output high impedance state when the detection circuit does not detect change of the logic level.

(Mode 5)

A semiconductor device according to mode 3 or 4, wherein the driver circuit updates data that is outputted to the first transmission wiring in synchronization with a clock, wherein the receiver circuit includes: an amplifier unit that is connected to the transmission wirings and that receives and amplifies the small-amplitude signal; and an output unit that changes the small-amplitude signal amplified by the amplifier unit into a signal having a larger amplitude, that is, having a high level and a low level used by the second logic circuit and that outputs the signal, and wherein the semiconductor device includes a reception control unit that increases/decreases a current flowing through the amplifier unit in synchronization with the clock and that increases/decreases an output impedance value of the output unit in synchronization with the clock during a reception period of the small-amplitude signal.

Each disclosure of the aforementioned Patent Documents is incorporated herein by reference thereto.

While examples have thus been described, the present invention is not limited thereto. The present invention of course includes various variations and modifications that could be made by those skilled in the art within the scope of the present invention.

It should be noted that other objects, features and aspects of the present invention will become apparent in the entire disclosure and that modifications may be done without departing the gist and scope of the present invention as disclosed herein and claimed as appended herewith. Also it should be noted that any combination or selection of the disclosed and/or claimed elements, matters and/or items may fall under the modifications aforementioned.

What is claimed is:

1. A semiconductor device comprising:

a plurality of first receivers, each operating at a first operation voltage, receiving a single-ended input signal having a small amplitude, and having a function of sensing the single-ended input signal;

a plurality of first drivers, each operating at a second operation voltage lower than the first operation voltage and outputting the single-ended input signal having a first voltage difference with a first impedance value;

a plurality of first transmission wirings, each having a first length corresponding to a distance between one of the first drivers and one of the first receivers and transmitting the single-ended input signal;

a common reference signal inputted to each of the plurality of first receivers;

a second driver operating at the second operation voltage and outputting the reference signal with a second impedance value higher than the first impedance value;

a second transmission wiring having at least the first length and transmitting the reference signal; and first and second internal power supply generation circuits, relating to the second operation voltage, generating high- and low-side potentials of the single-ended input signal, respectively, supplying the potentials to each of the plurality of first drivers, and outputting the potentials to first and second power supply wirings having at least the first length, respectively, wherein the second transmission wiring is arranged between the first and second power supply wirings, without the plurality of first transmission wirings being arranged between the first and second power supply wirings, and wherein the plurality of first transmission wirings are arranged close to each other, without being sandwiched between the first and second power supply wirings.

2. The semiconductor device according to claim 1,
wherein the single-ended input signal has the first voltage difference represented by a first potential corresponding to a first logic level and a second potential corresponding to a second logic level, and wherein each of the first receivers outputs a voltage having a second voltage difference that is larger than the first voltage difference and that relates to the first operation voltage.

3. The semiconductor device according to claim 1,
wherein each of the first receivers comprises a differential circuit having first and second differential input terminals connected to the single-ended input signal and the reference signal, respectively, and wherein each of the first drivers is an inverter comprising first and second transistors are mutually different conductivity type and connected in series to each other.

4. The semiconductor device according to claim 3,
wherein the second driver comprises at least a resistive element connected to the second transmission wiring.

5. The semiconductor device according to claim 1, further comprising:
a plurality of control signals each for performing mutual exclusion control, wherein each of the plurality of first drivers controlled by the plurality of control signals is selectively connected to one of the first transmission wirings each corresponding to one of the first receivers.

* * * * *